(12) United States Patent
Shirato et al.

(10) Patent No.: US 6,366,341 B1
(45) Date of Patent: Apr. 2, 2002

(54) EXPOSURE METHOD AND EXPOSURE APPARATUS

(75) Inventors: Akinori Shirato, Sagamihara; Kazuhiko Hori, Yokohama; Toshio Matsuura, Tokyo, all of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/636,813

(22) Filed: Aug. 10, 2000

(30) Foreign Application Priority Data

Aug. 20, 1999 (JP) .......................................... 11-234771

(51) Int. Cl.⁷ .................. G03B 27/72; G03B 27/42; G03B 27/32; A61N 5/00; G03G 15/043
(52) U.S. Cl. ............................ 355/69; 355/35; 355/53; 355/67; 355/77; 250/492.2; 250/492.22; 399/51
(58) Field of Search ............................ 355/35, 53, 67, 355/69, 77; 250/492.2, 492.22; 399/51

(56) References Cited

U.S. PATENT DOCUMENTS

| | | |
|---|---|---|
| 4,181,860 A * | 1/1980 | Sumi .......................... 250/492 |
| 5,227,839 A | 7/1993 | Allen .......................... 355/53 |
| 5,291,240 A | 3/1994 | Jain |
| 5,486,896 A | 1/1996 | Hazama et al. |
| 5,526,093 A | 6/1996 | Takahashi .................... 356/53 |
| 5,728,495 A | 3/1998 | Ozawa ......................... 430/30 |
| 6,097,473 A * | 8/2000 | Ota et al. ..................... 355/53 |
| 6,104,474 A * | 8/2000 | Suzuki ......................... 355/69 |

* cited by examiner

*Primary Examiner*—Russell Adams
*Assistant Examiner*—Khaled Brown
(74) *Attorney, Agent, or Firm*—Oliff & Berridge, PLC

(57) ABSTRACT

At the time of transferring the pattern image of a mask onto a substrate, an exposure apparatus overlays peripheral portions of exposure areas with respect to a pattern image, which has previously been transferred onto the substrate, with each other, and transfers a predetermined pattern onto the substrate. This exposure apparatus comprises a dose adjusting device capable of adjusting the dose of exposure light at the overlying portion, a shape measuring unit for measuring the shape of the pattern image of the overlying portion formed on the substrate, and a control section for controlling the dose adjusting device based on the result of measurement by the shape measuring unit in such a way that the shape of the pattern image of the overlying portion formed on the substrate becomes an intended shape.

24 Claims, 19 Drawing Sheets

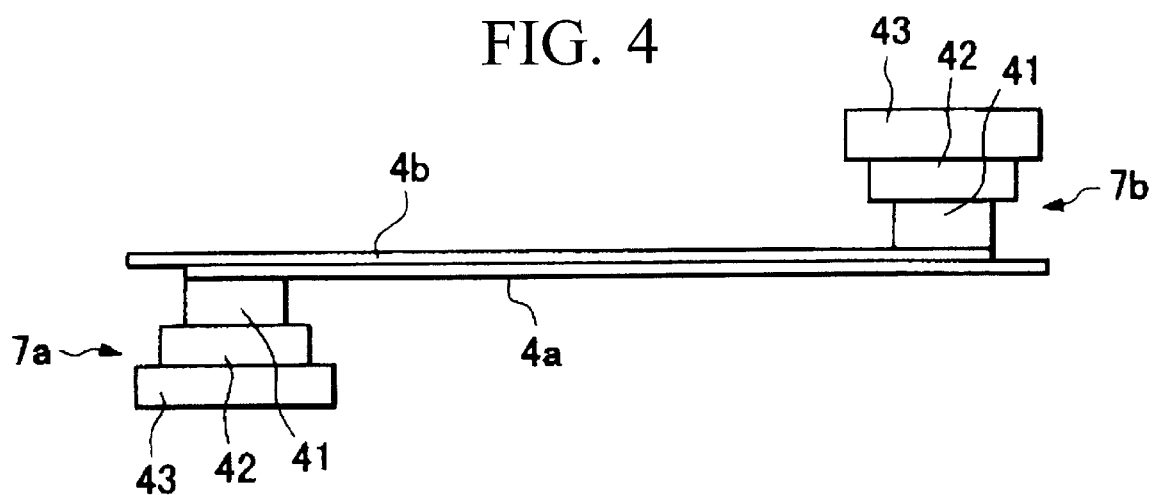

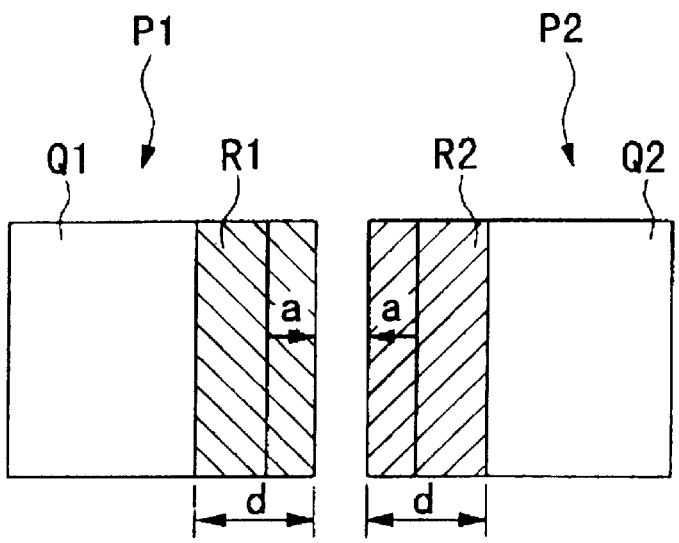
FIG. 9A
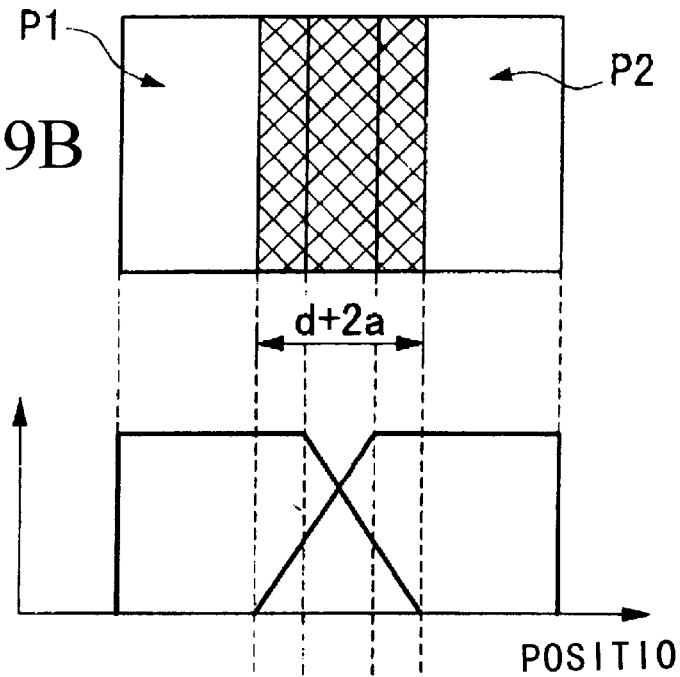
FIG. 9B
FIG. 9C
FIG. 9D

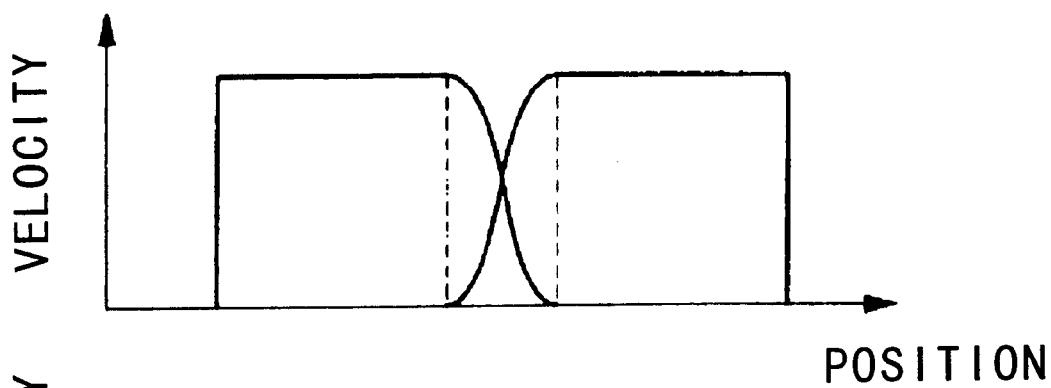
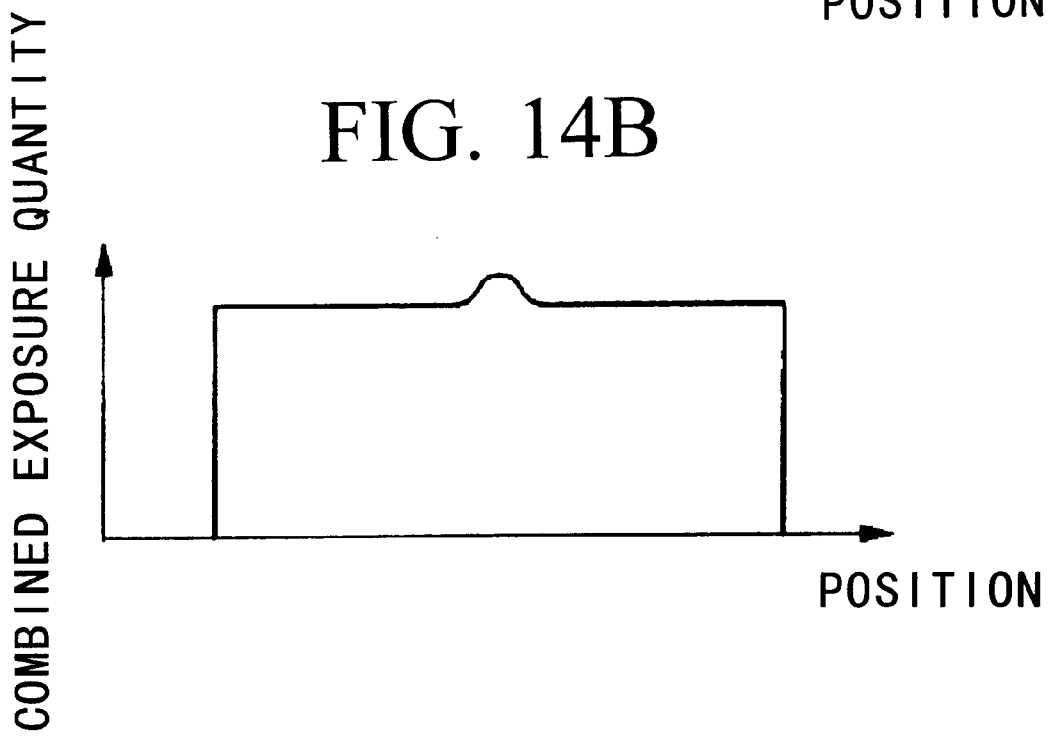

EXPOSURE METHOD AND EXPOSURE APPARATUS

BACKGROUND OF THE INVENTION

1. Field of the Invention

The present invention relates to an exposure method and exposure apparatus for transferring a pattern on a substrate while overlaying peripheral portions of pattern images of a mask, which is to be illuminated with exposure light, with each other.

2. Description of the Related Art

Conventionally, an exposure apparatus which projects a pattern image, formed on a photomask or reticle (hereinafter called "mask"), onto a substrate on whose surface a photosensitive agent, such as a photoresist, is applied, via a projection optical system is generally used in manufacturing semiconductor devices, liquid crystal display devices, thin-film magnetic heads or the like through a photolithography process.

One way to cope with an enlargement of a substrate to be exposed is the use of a pattern synthesizing scheme which divides the exposure area of the substrate into a plurality of sub areas and repeats exposure according to the individual sub areas to finally synthesize patterns into a desired pattern. To prevent a seam of patterns at the peripheral portions of the individual exposure areas from being produced due to a writing error for a mask for pattern projection, the lens aberration of the projection optical system, a positioning error of a stage which positions a substrate, and so forth, exposure is carried out with the peripheral portions of the exposure areas overlaid with each other by a slight amount at the time of implementing the pattern synthesizing scheme. However, overlaying exposure areas leads to double exposure of the overlying portion, thus changing the line width at the overlying portion of pattern images. Further, the pattern synthesis produces a step (difference in height) at the overlying portion of patterns due to misregistration of adjoining exposure areas, which may degrade the characteristics of the devices. In the case where a step of overlaying multiple synthesized patterns one on another is assigned to a plurality of exposure apparatuses, an overlying error of exposure areas of the individual layers discontinuously at the seams of the patterns due to a variation in the lens aberration of the individual exposure apparatuses may occur. This significantly impairs the quality of devices.

Japanese Patent Application, First Publication No. Hei 6-244077, discloses a technique of eliminating the aforementioned problem of pattern synthesis. This technique uses a filter for reducing the amount of light transmission, provided at a position corresponding to the overlying portion of pattern images, so that the dose of the exposure light at the overlying portion of pattern images approximately matches the dose of the exposure light at other portions. Japanese Patent Application, First Publication No. Hei 6-302501, discloses a divisional exposure technique that uses a blind for continuously changing the illumination range of exposure light to a mask within the range that corresponds to the overlying portion of pattern images during exposure on a substrate. This technique likewise allows the dose of the exposure light at the overlying portion of the pattern images on the substrate to approximately match the dose of the exposure light at other portions.

Those methods are effective in that exposure can be carried out with the dose of the exposure light at the overlying portion of pattern images approximately matching the dose of the exposure light at other portions. Even if the light exposure quantities at the individual portions on a substrate coincide with one another, however, the shape of the pattern image to be formed on the substrate after development may vary at the individual positions of the overlying portion. If the first and second exposure positions at the overlying portion are slightly shifted, for example, the shape of the pattern image to be formed after development may vary at the individual positions due to a difference in resist sensitivity (the degree of a change in the shape of a pattern which is caused by a change in conditions, such as the developer used at the developing time and the developing time).

The dose of the exposure light at the overlying portion of pattern images on a substrate is adjusted based on the result of measurements by an illuminance sensor or the like. If this illuminance sensor has a measuring precision error, the actual dose of the exposure light at the individual positions of the overlying portion may vary.

In short, even with the dose of the exposure light adjusted by those methods, the line widths of actual patterns may vary from one position to another.

SUMMARY OF THE INVENTION

Accordingly, it is an object of the present invention to provide an exposure method and exposure apparatus which can form a pattern in such a way that the shape of the pattern matches an intended shape at each portion on a substrate at the time of transferring a pattern image of a mask illuminated with exposure light onto the substrate while overlaying peripheral portions of the pattern images with each other.

To achieve the above object, the present invention employs the following structures.

At the time of transferring a pattern image of a mask illuminated with exposure light onto a substrate, an exposure method according to the present invention performs exposure by overlaying peripheral portions of exposure areas with respect to a pattern image, which has previously been transferred onto the substrate, with each other, and adjusts the dose of the exposure light on the overlying portion based on a shape of a pattern image for an overlying portion formed on the substrate in such a way that the shape of the pattern image becomes an intended shape.

According to the present invention, the shape of a pattern image formed on the substrate is measured and the dose of the exposure light at the overlying portion is adjusted based on the measured result, so that the shape of the pattern image at the overlying portion can be matched with an intended shape without being affected by the measuring precision error of the illuminance sensor, a difference in resist sensitivity and so forth.

An exposure apparatus according to the present invention transfers a pattern on a substrate while overlaying peripheral portions of pattern images with each other, and comprises an illumination optical system which illuminates a mask with exposure light from a light source; a projection optical system which projects a pattern image of the mask onto the substrate; a dose adjusting device capable of adjusting a dose of the exposure light at the overlying portion; a shape measuring system which measures a shape of a pattern image of the overlying portion formed on the substrate; and a control system which controls the dose adjusting device based on a result of the measurement by the shape measuring system in such a way that the shape of the pattern image of the overlying portion formed on the substrate becomes the intended shape.

The dose of the exposure light at the overlying portion is adjusted by setting the dose of the exposure light at the peripheral portion of a pattern image in such a way as to become smaller in a direction away from a center of the pattern image and changing an overlying range of the peripheral portions of pattern images.

In this case, the exposure area is determined by a light-shielding section; and the dose of the exposure light at the peripheral portion can be set by continuously changing a moving speed of the light-shielding section which displaces in synchronism with exposure.

The above setting can be implemented by the dose adjusting device which comprises a light-shielding section capable of arbitrarily setting an area on the mask to be illuminated with the exposure light; and a light-shielding-section displacing device which displaces the light-shielding section in such a way that a dose of the exposure light at the peripheral portion of the pattern image becomes smaller in a direction away from a center of the pattern image in synchronism with exposure.

The light-shielding-section displacing device may be designed to be able to arbitrarily set a displacement start position of the light-shielding section, so that the range of the overlying portion can be set arbitrarily.

The light-shielding-section displacing device may be designed to be able to arbitrarily set a displacement speed of the light-shielding section, so that the distribution of exposure light in the range of the overlying portion can be adjusted.

Alternatively, the exposure area may be determined by a light-shielding section including a light-reducing member having a light-reducing characteristic which makes a light transmittance smaller in a direction away from a center of the pattern image; and the dose of the exposure light at the peripheral portion may be adjusted by changing an area of an overlying portion formed by the light-reducing member by using the light-reducing member.

The determination of the exposure area and the dose adjustment mentioned previously are carried out by the dose adjusting device. This dose adjusting device comprises a light-reducing member which is provided at a periphery of an opening and passes the exposure light so as to make a light transmittance smaller in a direction away from a center of the opening; and a light-reducing-member position adjusting device which adjusts a position of the light-reducing member.

The exposure apparatus may further comprise a dose measuring system which measures a dose of the exposure light at the overlying portion of a pattern image to be irradiated on the substrate and a dose of the exposure light at other portions than the overlying portion. This structure makes it possible to measure the dose of the exposure light on the substrate and uniformly adjust the dose of the exposure light on the substrate based on the measured result.

A device production method according to another aspect of the present invention comprises: exposing a predetermined pattern on a substrate using the above exposure method; and developing the substrate after the exposure.

In a device production method according to another aspect of the present invention, devices are produced by exposing a plurality of patterns on a substrate while overlaying peripheral portions of the patterns on each other to form an overlying portion. This device production method comprises: a step of adjusting an amount of overlaying of the peripheral portions so as to change light exposure quantities in the overlying portion and in non-overlying portions which are adjacent to the overlying portion; and a step of exposing the plurality of patterns on the substrate based on the adjusted amount of overlaying.

The step of adjusting may comprise: a step of measuring a pattern shape of the overlying portion exposed on the substrate; and a step of obtaining an amount of overlaying of the peripheral portions based on the pattern shape measured in the step of measuring.

BRIEF DESCRIPTION OF THE DRAWINGS

FIGS. 2 through 4 are diagrams for explaining a dose adjusting device in FIG. 1;

FIGS. 9A through 9D are diagrams for explaining the relationship between a pattern image on a substrate and the light exposure quantity;

FIGS. 14A and 14B are diagrams for explaining the relationship between the moving speed of a light-shielding section and the light exposure quantity on a substrate;

DETAILED DESCRIPTION OF THE PREFERRED EMBODIMENTS

An exposure method and exposure apparatus according to an embodiment of the present invention will now be described with reference to the accompanying drawings.

Figure 1:
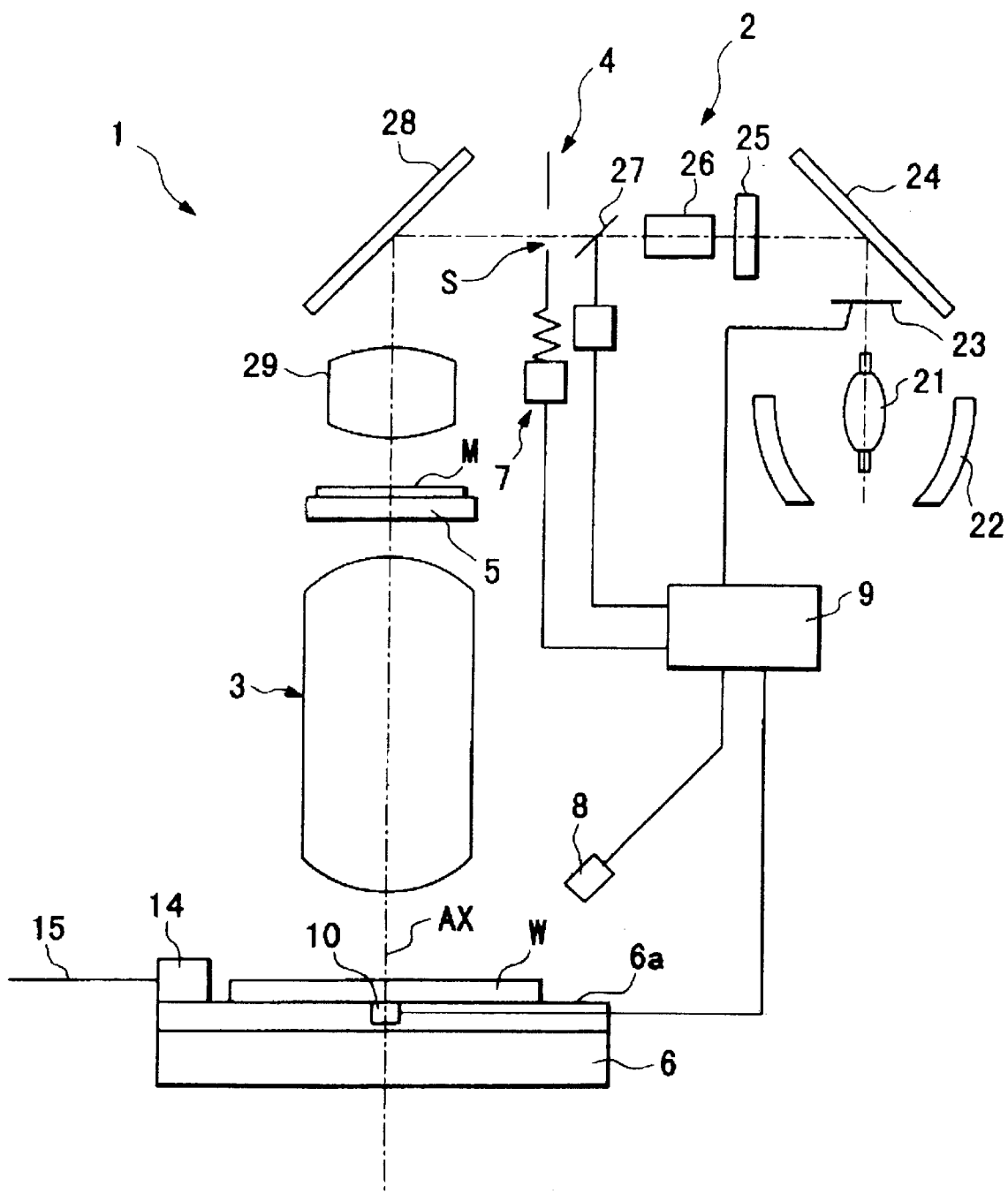
FIG. 1 is a schematic diagram illustrating an exposure apparatus according to a first embodiment of the present invention.
Figure 2:
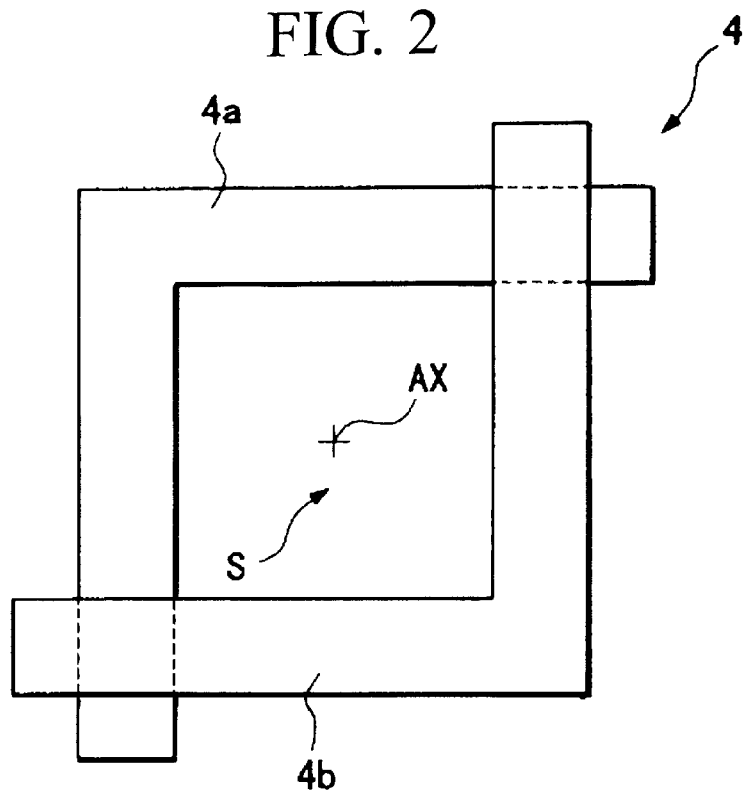
Figure 3:
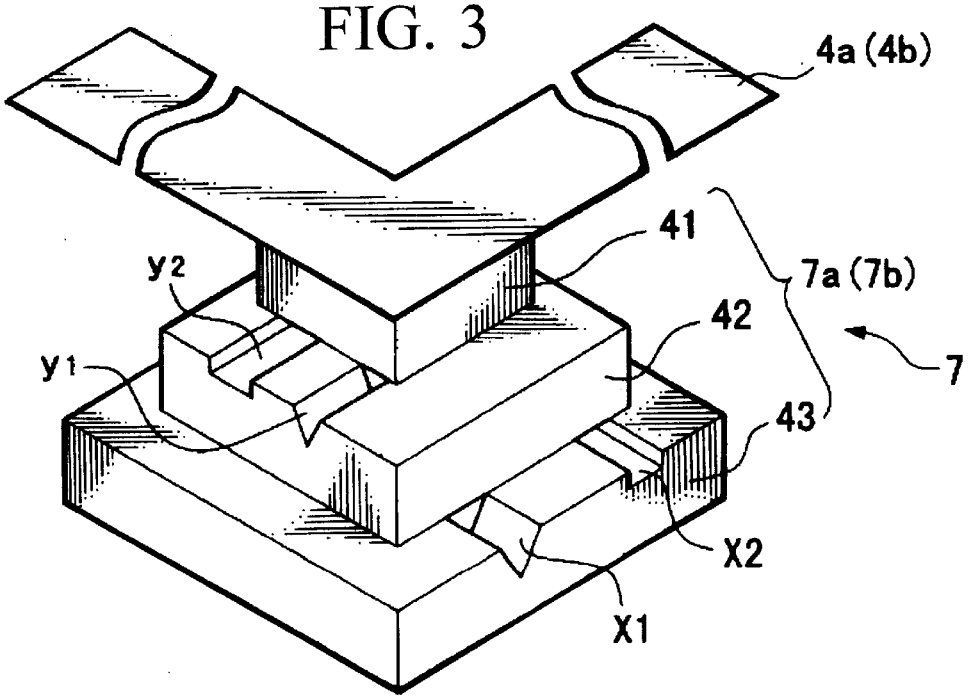

FIG. 1 is a schematic diagram illustrating an exposure apparatus according to the present invention.

Referring to FIG. 1, an exposure apparatus 1 comprises an illumination optical system 2 for illuminating a mask M with exposure light from a light source 21, a dose adjusting device 4, provided in this illumination optical system 2, for adjusting the area of an opening S where a bundle of rays or light passes, thereby defining the illumination range of the light on the mask M, a mask stage 5 for holding the mask M, a projection optical system 3 for projecting a pattern image of the mask M illuminated with light onto a substrate (wafer) W, a substrate holder 6a for holding the substrate W, a substrate stage 6 for supporting this substrate holder 6a, an illuminance sensor (dose measuring system) 10 for measuring the dose of the exposure light to be irradiated on the substrate W, and a line width measuring unit (shape measuring system) 8 for measuring the shape of a pattern image formed on the substrate W. The dose adjusting device 4, the illuminance sensor 10, and the line width measuring unit 8 are connected to a control section 9.

The illumination optical system 2 includes an elliptic mirror 22 for condensing light from the light source 21 which is comprised of an extra-high pressure mercury lamp, a wavelength filter 25 that passes only that wavelength component which is needed for exposure and which is included in the light condensed by the elliptic mirror 22 and coming from a reflector 24 in response to the opening/closing operation of a shutter 23, a fly-eye integrator 26 for adjusting the illumination light, passed through the wavelength filter 25, into light of a uniform illuminance distribution, and a reflector 28 which guides the illumination light passed through the dose adjusting device 4 to a lens system 29.

The dose adjusting device 4 is located between the fly-eye integrator 26 and the reflector 28 which leads the illumination light to the lens system 29. Disposed between the fly-eye integrator 26 and the dose adjusting device 4 is a half mirror 27 which causes part of the illumination light emerging from the fly-eye integrator 26 to enter an integrating exposure meter 17. The integrating exposure meter 17 is connected to the control section 9, which controls the opening/closing time of the shutter 23 based on information from the integrating exposure meter 17. That is, the amount of exposure (the dose of the exposure light) to the substrate W is controlled by controlling the opening/closing time of the shutter 23.

As shown in FIGS. 1 through 4, the dose adjusting device 4 has a pair of light-shielding sections (blades) 4a and 4b, which are each bent into an L shape two-dimensionally and forms a rectangular opening S when combined within a plane perpendicular to the optical axis, AX, of exposure light, and a light-shielding-section displacing device 7 which displaces those blades 4a and 4b within the plane perpendicular to the optical axis AX based on an instruction from the control section 9. The size of the opening S changes in accordance with the displacement of the blades 4a and 4b made by the light-shielding-section displacing device 7. Of a bundle of rays coming from the fly-eye integrator 26, those that have passed the opening S are sent to the lens system 29. The exposure light that has been defined by the opening S illuminates a specific area of the mask M via the lens system 29, thus exposing a pattern image of the mask M on a specific area of the substrate W.

The light-shielding-section displacing device 7 has two drive mechanisms 7a and 7b for respectively driving the blades 4a and 4b. Each of the drive mechanisms 7a and 7b is a combination of a first block 41, a second block 42 and a third block 43 also fixed to the associated one of the blades 4a and 4b. As the first block 41 is moved along guide grooves y1 and y2 and the second block 42 is moved along guide grooves x1 and x2 by an unillustrated feeding mechanism which is a combination of a servo motor and a ball screw, the blades 4a and 4b are moved within a plane perpendicular to the optical path of the illumination light. As shown in FIG. 4, the drive mechanisms 7a and 7b are arrange opposite to each other with respect to the blades 4a and 4b, and each third block 43 is integrally secured to the body portion (not shown) of the exposure apparatus by an unillustrated frame.

The blades 4a and 4b are provided so as to be displaceable by the light-shielding-section displacing device 7 in synchronism with exposure. The light-shielding-section displacing device 7 can arbitrarily set the displacement start position and displacement speed of the blades 4a and 4b. As those blades 4a and 4b are so displaced as to widen the opening S in synchronism with exposure, the dose of the exposure light at the peripheral portion of a pattern image formed on the mask M is so set as to become smaller in the direction away from the center of the pattern image. The driving of the light-shielding-section displacing device 7 is controlled by a signal from the control section 9.

The projection optical system 3 serves to form a pattern image, located in the illumination range of the mask M that is defined by the opening S, on the substrate W and expose the pattern image on a specific area on the substrate W.

The substrate stage 6 is comprised of a pair of stacked blocks that are movable in directions perpendicular to each other, and is movable in the horizontal direction on an X-Y plane. That is, the substrate W fixed to this substrate stage 6 is so supported as to be movable in the horizontal direction (perpendicular to the optical axis of the projection optical system 3) on an X-Y plane. The position of the substrate stage 6 is detected based on reflected light of a laser beam 15 from an unillustrated laser interferometer system, which is reflected from a movable mirror 14 on the substrate stage 6. Based on the detected position, the position of the substrate W within a horizontal plane is adjusted.

The line width measuring unit (shape measuring system) 8 which measures the shape of a pattern image formed on the substrate W is provided on the substrate stage 6. This line width measuring unit 8, which measures the line widths (short dimensions) of a pattern formed on the substrate W, is constructed by an optical or electron beam type measuring unit, such as an optical interference type meter or a length-measuring SEM.

The illuminance sensor (dose measuring system) 10, which measures the dose of the exposure light to be irradiated on the substrate W, is provided at part of the substrate holder 6a. Before single or multiple exposures, the illuminance sensor 10 is scanned in the horizontal direction (X-Y direction) under an exposure area corresponding to the exposure light from the projection optical system 3 by an unillustrated driving unit and guide shaft. Therefore, the illumination light intensity (illuminance) on the exposure surface of the substrate W is two-dimensionally measured by the illuminance sensor 10. The illuminance data detected by this illuminance sensor 10 is sent to the control section 9.

A description will now be given of a method of transferring a pattern image of the mask M onto the substrate W by the exposure apparatus 1 which has the above-described structure.

This exposure apparatus 1 exposes pattern images formed on a mask M having a two-dimensionally rectangular shape on different exposure areas on the substrate W with the peripheral portions of the pattern images overlaid one on another. Specifically, after a single exposure using a single mask M is completed, this mask M is replaced with another mask M and the substrate stage 6 is moved to position another area on the substrate W to the projection optical system 3 after which a second exposure is carried out. By repeating similar procedures for each exposure, the entire area of the substrate W is exposed.

In the following description, the portions of the peripheral portions of pattern images on the substrate W which are overlaid one on another are called "overlying portion" and the dose of exposure light to the substrate W is called "exposure quantity".

The exposure method according to this invention comprises a step (step 1) of measuring the exposure quantity at each position of the overlying portion and the exposure quantity to the portion other than the overlying portion using the illuminance sensor 10, a step (step 2) of setting the operation of the dose adjusting device 4 under the control of the control section 9 in such a way that the exposure quantity at each position of the overlying portion coincides with the exposure quantity to the portion other than the overlying portion, a step (step 3) of performing an exposure process to the substrate W while adjusting the exposure quantity to the overlying portion using the dose adjusting device 4, a step (step 4) of performing a developing process to the substrate W that has undergone the exposure process, a step (step 5) of measuring the shape (line width) of the overlying portion at each position and the shape (line width) of the portion other than the overlying portion by using the line width measuring unit 8, a step (step 6) of setting the operation of the dose adjusting device 4 again based on the result of measurement by the line width measuring unit 8 in such a way that the line width of the overlying portion matches with a target value (the line width of the portion other than the overlying portion), and a step (step 7) of performing an exposure process to the substrate W while adjusting the exposure quantity to the overlying portion using the dose adjusting device 4 whose operation has been set again. The following will discuss the individual steps specifically.

Step 1

First, with the substrate W not placed on the substrate holder 6a, the size of the opening S with respect to a pattern area on the mask M to be exposed is set. The opening S is arbitrarily set in accordance with a pattern area on the mask M to be exposed. As the shutter 23 is opened by the control section 9, exposure light from the light source 21 passes through the opening S and illuminates the mask M placed on the mask stage 5. The blades 4a and 4b are displaced in such a way as to widen the opening S in synchronism with this exposure. That is, the blades 4a and 4b are moved outward from the center of the opening S. Those blades 4a and 4b make the dose of exposure light at the peripheral portion of a pattern image smaller in the direction away from the center of the pattern image. The illuminance sensor 10 measures the exposure quantity at that time.

The illuminance sensor 10 is scanned under the exposure area that corresponds to the projection optical system 3. The illuminance of this entire exposure area is measured by the illuminance sensor 10. That is, the illuminance sensor 10 measures the illuminance of the center portion (an area of a constant light amount) of the exposure area and the illuminance of the peripheral portion (a light-reduced area) of the exposure area, which corresponds to the overlying portion. The results of measuring the illuminance of the exposure area and the illuminance of the peripheral portion are sent to the control section 9.

When measurement of the exposure quantity with a single mask M is completed, the substrate stage 6 is moved in the horizontal direction, this mask M is replaced with another mask M and the exposure quantity with the new mask M is measured. The pattern image formed by the second exposure is exposed in such a way that its peripheral portion overlies the peripheral portion of the pattern image formed by the first exposure. As this process is performed for all the masks M that should be used in the exposure, the exposure quantity to the overlying portion and the exposure quantity to other portions than the overlying portion are measured by the illuminance sensor 10.

Step 2

Based on a detection signal from the illuminance sensor 10, the control section 9 sets the moving speed of the blades 4a and 4b of the dose adjusting device 4 in such a manner that the illuminance of the overlying portion at each position approximately matches with the illuminance of the portion other than the overlying portion.

Figure 5A:
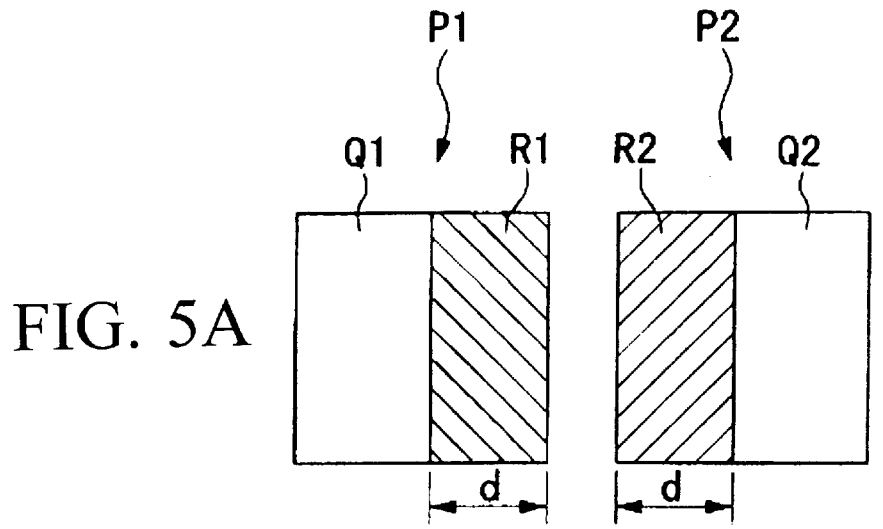
FIGS. 5A through 5D are diagrams for explaining the relationship between a pattern image on a substrate and the exposure quantity.

As shown in FIGS. 5A through 5D, the exposure quantity on the substrate W is reduced in the moving ranges of the blades 4a and 4b. FIGS. 5A through 5D are diagrams for explaining the exposed image on the substrate W and the exposure distribution when exposure is carried out with the opening S of the dose adjusting device 4 set moderately. As shown in FIG. 5A, different exposure areas P1 and P2 respectively have light-reducing areas R1 and R2 indicated by hatching. The light-reducing areas R1 and R2 are formed by moving the blades 4a and 4b. That is, the moving ranges of the blades 4a and 4b are the light-reducing areas R1 and R2 of the exposure areas P1 and P2. In other words, the moving distances "d" of the blades 4a and 4b respectively become the widths of the light-reducing areas R1 and R2. The light-reducing areas R1 and R2 are so set as to become smaller in the direction away from the centers of the exposure areas P1 and P2.

Figure 5B:
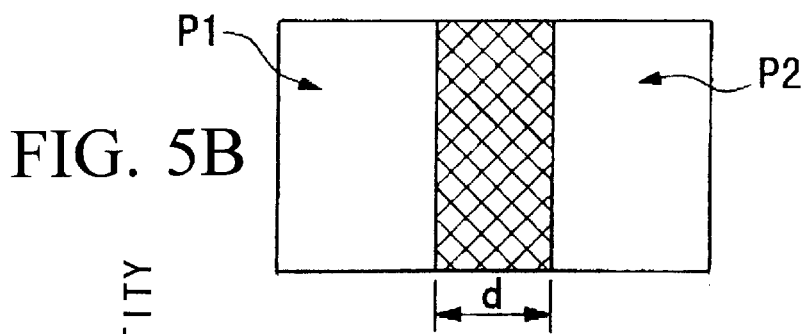
Figure 5C:
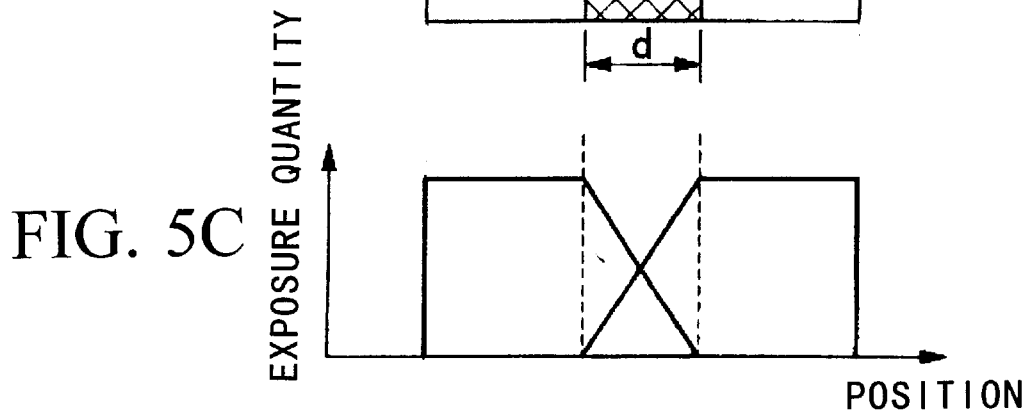
Figure 5D:
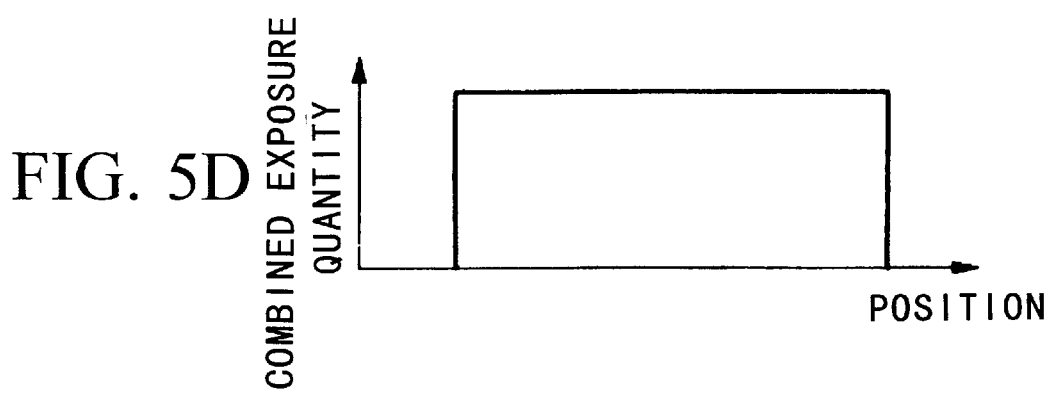

As shown in FIG. 5B, combining the exposure areas P1 and P2 provides an exposure quantity distribution as shown in FIG. 5C. At this time, the amount of light reduction in one of the light-reducing areas R1 and R2 in the overlapping range of the light-reducing areas R1 and R2 changes so as to supplement a variation in the amount of light reduction in the other one. As a result, as shown in FIG. 5D, the combined exposure quantity in the overlapping range of the light-reducing areas R1 and R2 coincides with the exposure quantities of areas Q1 and Q2 with constant light amounts (outlined portions) in FIG. 5A which will not be influenced by the blades 4a and 4b.

As the displacement start position and the moving speed of the blades 4a and 4b are arbitrarily set, the overlapping range of the light-reducing ranges (peripheral portions) R1 and R2 changes. This change in the overlapping range allow the dose of exposure light at the overlying portion to be adjusted.

The control section 9 sets the displacement start position and the moving speed of the blades 4a and 4b of the dose adjusting device 4 in such a way that the combined exposure quantity at the overlying portion of pattern images on the substrate W approximately match with the amount of light in the constant-light-amount areas Q1 and Q2. In this case, the moving distance "d" is constant and the moving speed is uniform.

Step 3

With the exposure quantity to the overlying portion of pattern images on the substrate W adjusted, the substrate W is placed on the substrate holder 6a and exposure is carried out. That is, exposure takes place under a state where the combined exposure quantity to the overlying portion of the adjoining exposure areas P1 and P2 is so adjusted as to match the exposure quantity to the portion other than the overlying portion.

As the displacement start position of the blades 4a and 4b is set in step 2, the size of the opening S is set. As the shutter 23 is opened by the control section 9, the exposure light from the light source 21 passes through the opening S, is reflected at the reflector 28, and illuminates the mask M placed on the mask stage 5 via the lens system 29. In synchronism with this exposure, the blades 4a and 4b are moved outward from the center side of the opening S at the moving speed set in step 2. The movement of the blades 4a and 4b causes the exposure quantity at the peripheral portion of each pattern image to become smaller in the direction away from the center of the pattern image. At the same time, the integrating exposure meter 17 sends information of the integrated exposure quantity to the control section 9. When the integrated exposure quantity reaches a predetermined exposure quantity, the control section 9 closes the shutter 23 and stops moving the blades 4a and 4b.

When exposure to a single exposure area is completed, the substrate stage 6 is moved in the horizontal direction, this mask M is replaced with another mask M, and exposure is carried out on an exposure area different from the first exposure area. The pattern image to be transferred by the second exposure is transferred in such a way that its peripheral portion overlies the peripheral portion of the pattern image transferred by the first exposure. The moving speed and the displacement start position of the blades 4a and 4b in this second exposure are also what has been set in step 2. As exposure is performed with all the masks M that should be used, pattern images are transferred in such a way that the peripheral portions of the previously transferred pattern image and the pattern image transferred subsequently overlie each other.

Although the foregoing description has been given of the case where pattern images are transferred after the mask M is replaced and the exposure area is changed between the first and second exposures, the second exposure may be carried out so that the same pattern on the same mask is transferred to an adjacent exposure area or a different pattern on the same mask is transferred.

Step 4

Next, a developing process is performed on the substrate W which has been exposed with the exposure quantity to the overlying portion approximately matching the exposure quantity to the portion other than the overlying portion based on the result of measurement by the illuminance sensor 10.

Step 5

The shape of each pattern image on the substrate W that has undergone the developing process is measured by the line width measuring unit 8. This line width measuring unit 8 serves to measure the shape of each pattern on the substrate W on which pattern images of the different mask M have been projected and which has undergone the developing process and can measure the shapes of the constant-light-amount areas Q1 and Q2 and the shape of the pattern image at the overlying portion of the light-reducing areas R1 and R2. The shape data (line width data) of the pattern on the substrate W that has been detected by the line width measuring unit 8 is sent to the control section 9.

Figure 6A:
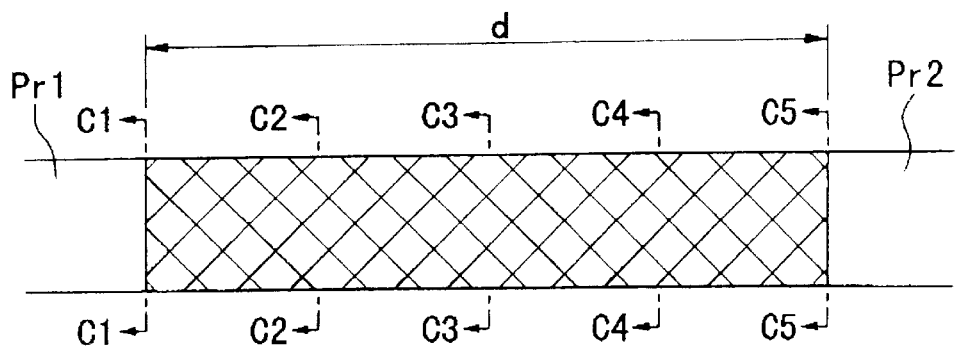
FIGS. 6A through 6E are diagrams for explaining the relationship between a pattern image on a substrate and the light exposure quantity.
Figure 6B:
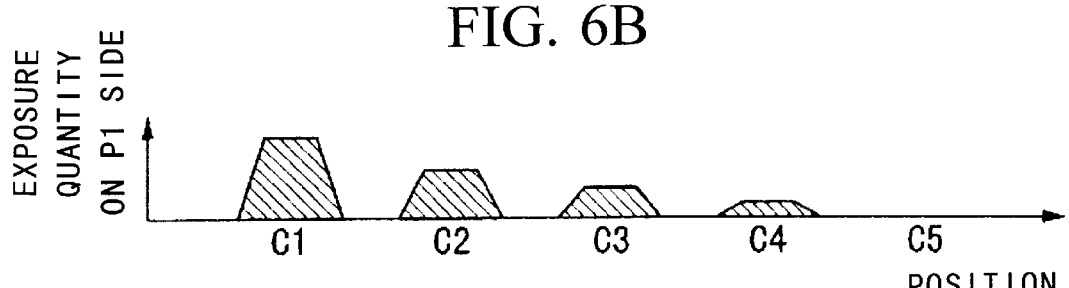
Figure 6C:
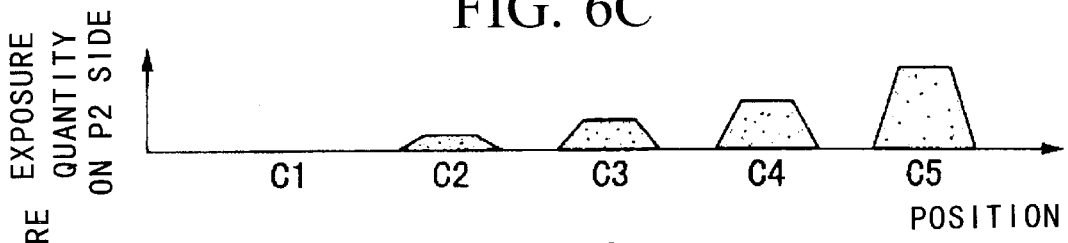
Figure 6D:
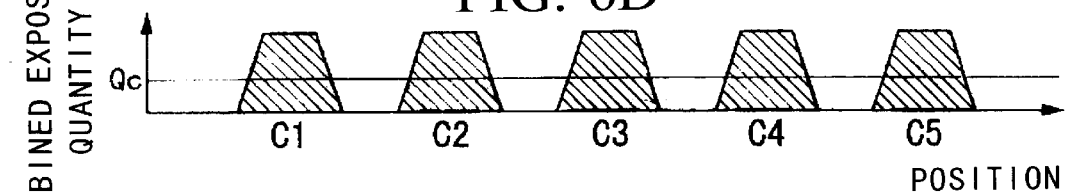
Figure 6E:
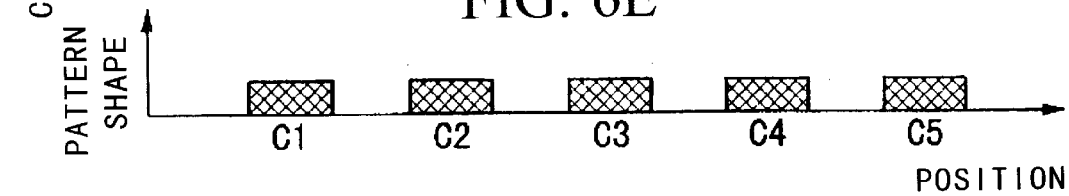

As shown in FIG. 6A, given that patterns at the overlying portion are Pr1 and Pr2, the line widths of the patterns Pr1 and Pr2 that are formed on the substrate W should be constant. That is, as shown in FIGS. 6B and 6C, the exposure quantities at positions c1 to c5 in the light-reducing areas R1 and R2 corresponding to the exposure areas P1 and P2 decrease proportionally outward of the patterns and the overlying portion of the patterns Pr1 and Pr2 coincides with the light-reducing areas R1 and R2 having a width d. Therefore, the maximum value of the combined exposure quantity becomes uniform at the individual positions c1–c5 as shown in FIG. 6D. When the substrate W which has undergone such exposure is developed, if the resist characteristics are designed in such a way that the portion whose exposure quantity exceeds a given exposure quantity Qc (e.g., 50% of the maximum exposure quantity) remains on the substrate W even after developing, the pattern widths at the individual cross-sectional positions c1–c5 should be constant as shown in FIG. 6E.

Figure 7:
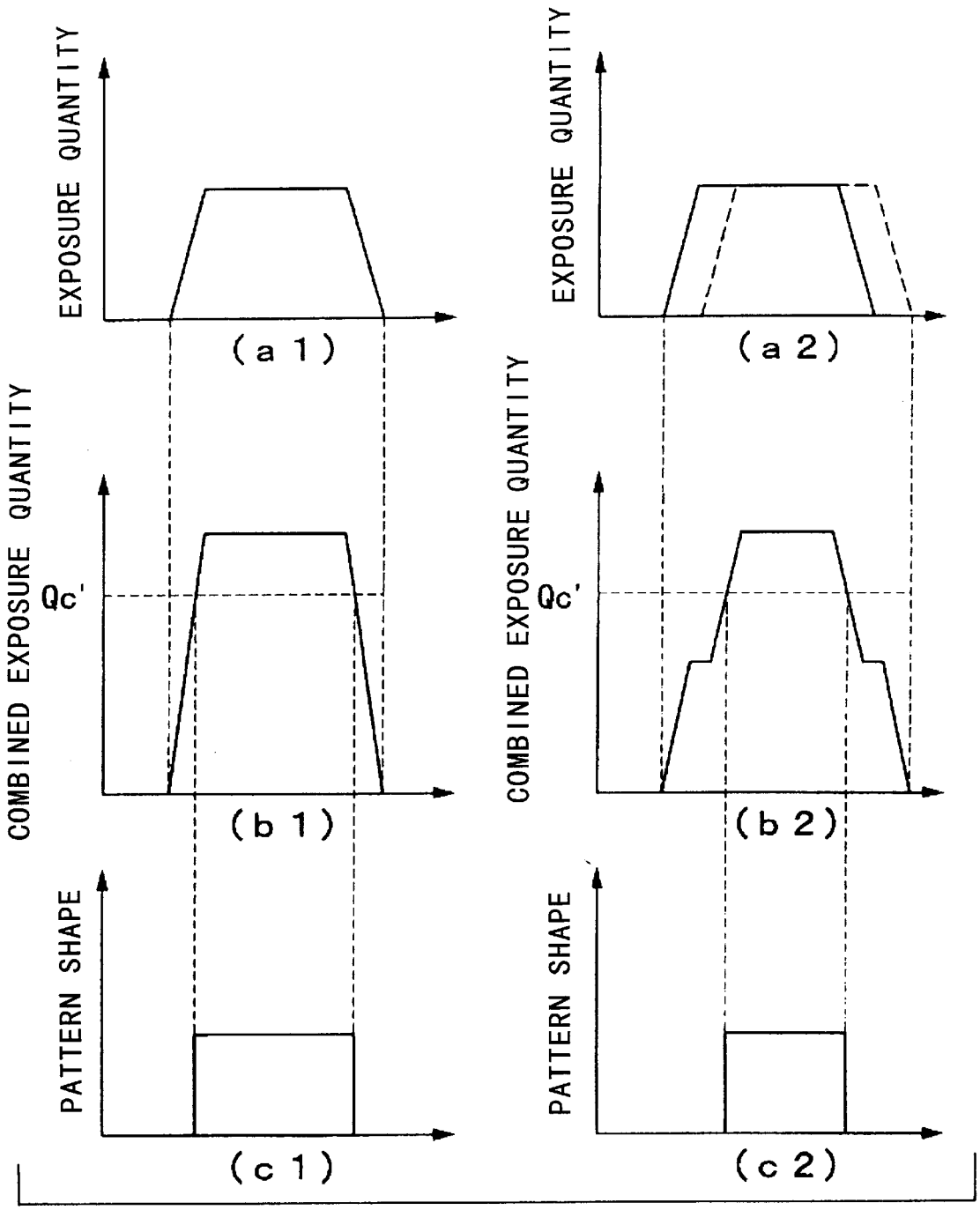
FIG. 7 is a diagram for explaining the case where the shape of a pattern on a substrate differs from an intended shape.

In the case where, for example, the exposure position at the overlying portion slightly differs between the first and second exposures, however, the shapes of the pattern images formed after developing may vary at the individual portions due to a difference in resist sensitivity. That is, when the first and second exposure positions differ from each other as shown in FIG. 7(a2), the combined exposure quantity becomes as shown in FIG. 7(b2), which differs from the exposure quantity distribution in the case where the exposure position is not shifted as shown in (a1) and (b1) in FIG. 7. If the resist characteristics are designed in such a way that the portion whose exposure quantity exceeds a given exposure quantity Qc' remains on the substrate W even after developing, the shape (line width) of the pattern formed on the substrate W may differ as shown in (c1) and (c2) in FIG. 7. As the dose of exposure light at the overlying portion of pattern images on the substrate is adjusted based on the result of measurement by the illuminance sensor 10, the actual dose of exposure light at the individual positions of the overlying portion may vary if this illuminance sensor 10 has a measuring precision error.

Accordingly, the control section 9 sets the operation of the dose adjusting device 4 again based on the result of measurement by the illuminance sensor 10 in such a way that the line width of the overlying portion coincides with a target value (the line width of the portion other than the overlying portion).

With no deviation of the exposure position, even if the combined exposure quantity is substantially the same as the exposure quantity at a position where double exposure is not performed, the line width eventually becomes thinner in some cases, depending on the characteristics of the resist at the time of double exposure. In this case, the operation of the dose adjusting device 4 is also set in such a way that the line width matches with the target value.

Steps 6 and 7

The control section 9 sets the dose adjusting device 4 so as to change the overlying range of the light-reducing areas R1 and R2.

Figure 8:
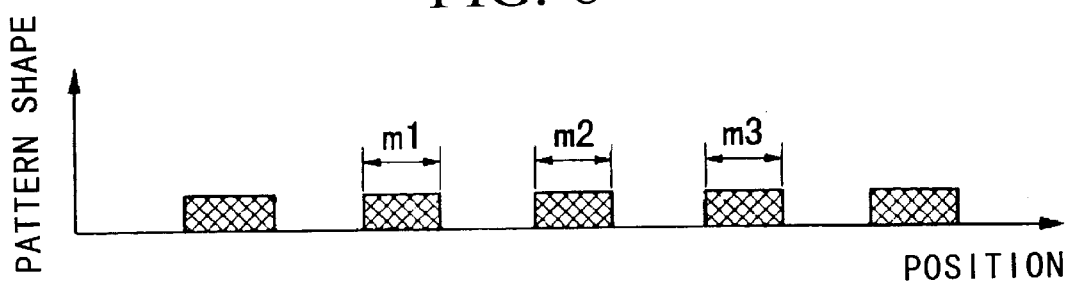
FIG. 8 is a diagram for explaining the shape of a pattern image on a substrate that is measured by a shape measuring system.

Let us consider the case where the line widths m1 to m3 of the shapes of the pattern images in the overlying range of the light-reducing areas R1 and R2 are formed thinner than target values, as shown in FIG. 8. That is, assume that the line widths of the pattern of the overlying portion of the light-reducing areas R1 and R2, which have been measured by the line width measuring unit 8 after the substrate W on which pattern images were transferred has been subjected to a developing process, are thinner than the target values. As the resist characteristics are designed in this embodiment in such a way that the portion whose exposure quantity exceeds the given exposure quantity Qc remains on the substrate W even after developing, the control section 9 sets the moving ranges of the blades 4a and 4b of the dose adjusting device 4 in such a way that the dose of exposure light to this overlying portion is increased.

Specifically, the control section 9 analyzes the difference between the line widths of the pattern images in the overlying portion and the line widths of the pattern images in the constant-light-amount areas Q1 and Q2 and sets the moving ranges of the blades 4a and 4b in such a way that the former line widths coincide with the latter line widths.

In this case, the combined exposure quantity to the overlying portion of the patterns on the substrate W is adjusted by changing the sizes (shot sizes) of the individual constant-light-amount areas Q1 and Q2. Specifically, the ranges of the constant-lightamount areas Q1 and Q2 are enlarged by changing the displacement start position of the blades 4a and 4b and the blades 4a and 4b are moved from this changed displacement start position.

That is, as shown in FIG. 9A, the displacement start position of the blades 4a and 4b is changed by a distance "a" to increase the constant-light-amount areas Q1 and Q2 that are formed by the opening S set in step 2. The blades whose displacement start position has been changed by the distance "a" are moved by a moving distance "d". This moving distance "d" is equal to the moving distance in the state where the illuminance of the overlying portion is so set as to match with the illuminance of the portion other than the overlying portion.

Of the patterns formed on a plurality of (two) masks M, the patterns that correspond to the overlying portion are formed identical.

The width of the overlying portion of the thus set shot sizes becomes "d+2a" as shown in FIG. 9B, and the exposure quantity at the overlying portion is set larger as shown in FIG. 9C. As shown in FIG. 9D, the combined exposure quantity to the overlying portion is so set as to be greater than the exposure quantity to the portion (constant-light-amount areas Q1 and Q2) other than the overlying portion. The moving speed of the blade 4a (4b) has not changed from the one set in step 2 and the pitch of the speed is set constant. Therefore, the light-reducing characteristic (the pitch of light reduction) of the light-reducing area R1 (or R2) of one exposure area P1 (or P2) is the same as the one set in step 2.

In the above-described manner, the line width measuring unit 8 measures the line widths of the pattern images in the overlying portion and when the measured widths are smaller than the target values, the control section 9 controls the dose adjusting device 4 in such a way as to increase the exposure quantity to the overlying portion.

The control section 9 adjusts the dose of exposure light at the overlying portion by using the dose adjusting device 4 based on the relationship between the amount of a change in the dose of exposure light and the amount of a change in the shape of the pattern image in the characteristics of the individual optical systems and the resist characteristics that have been acquired beforehand.

In this case, plural pieces of data about the amount of a change in the shape (line width) of the pattern image on the substrate W when the dose of exposure light is changed arbitrarily should have been obtained beforehand and the dose of exposure light at the overlying portion is adjusted based on those plural pieces of data (data table) in such a way that the results of measurement by the line width measuring unit 8 coincide with the target values (target line widths).

That is, the relationship between the amount of a change in the dose of exposure light at the overlying portion and the amount of a change in the shape (the amount of a change in each line width) of the pattern image on the substrate W can be set beforehand based on the results of experimental identification on the amount of a change in the shape of the pattern image on the substrate W with respect to the amount of a change in the dose of exposure light at the overlying portion.

Based on the above-described data table, the control section 9 allows the dose adjusting device 4 to adjust the dose of exposure light so that the line widths of the pattern image on the substrate W become the target line widths. That is, based on the results of measuring the line widths of the pattern image by the line width measuring unit 8 and the data table, the dose adjusting device 4 controls the doses of exposure light to the light-reducing areas R1 and R2 in such a way that the shape (line widths) of the pattern image at the overlying portion on the substrate W become the target line widths.

The relationship between the amount of a change in the dose of exposure light at the overlying portion and the amount of a corresponding change in the shape of the pattern image on the substrate W may be acquired as a relational equation based on the above-described data table, and the dose of exposure light at the overlying portion may be adjusted from the result of measurement by the line width measuring unit 8. In other words, the relational equation is obtained by acquiring data on the relationship between the amount of a change in the dose of exposure light and the amount of a change in the shape of the pattern image under a plurality of conditions and makes the aforementioned adjustment based on this data.

Figure 10A:
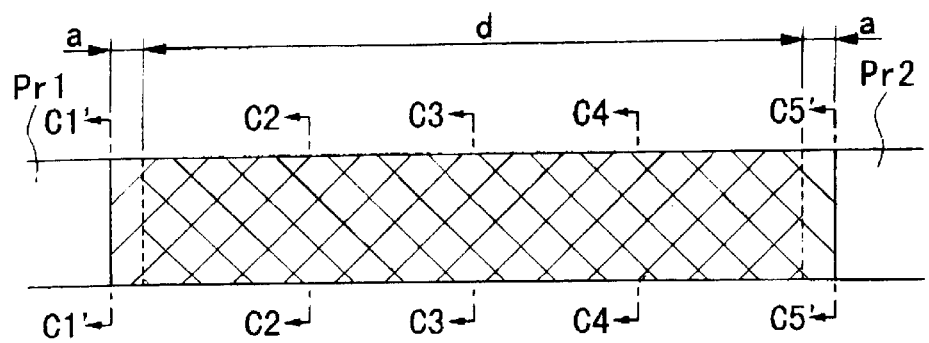
FIGS. 10A through 10E are diagrams for explaining the relationship between a pattern image on a substrate and the light exposure quantity.
Figure 10B:
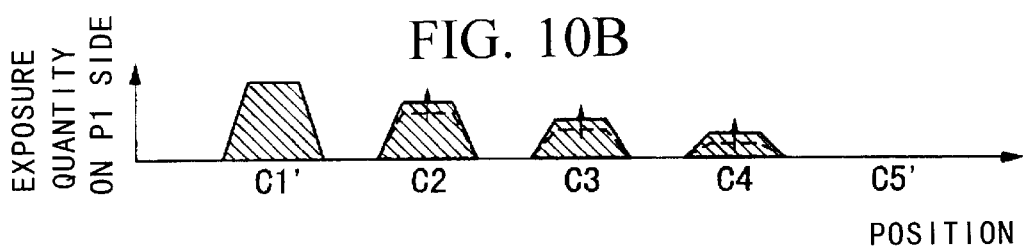
Figure 10C:
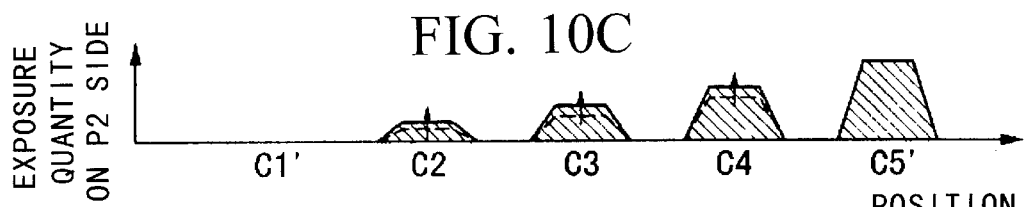
Figure 10D:
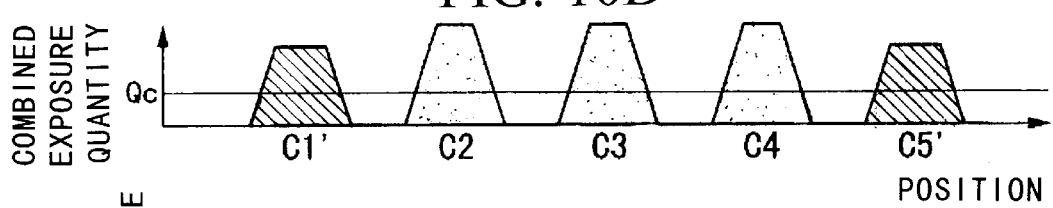

FIGS. 10A through 10E are diagrams showing the exposure quantity distribution at each position of the overlying portion in that state and the shapes of patterns after developing. As shown in FIG. 10B, the exposure quantities to the light-reducing area R1 of the shot P2 at positions c2, c3 and c4 become greater than those shown in FIG. 6B. Likewise, as shown in FIG. 10C, the exposure quantities to the light-reducing area R2 of the shot P2 at the positions c2, c3 and c4 become greater than those shown in FIG. 6C. As shown in FIG. 10D, therefore, the combined exposure quantity to the overlying portion becomes greater than the one shown in FIG. 6D.

Figure 10E:
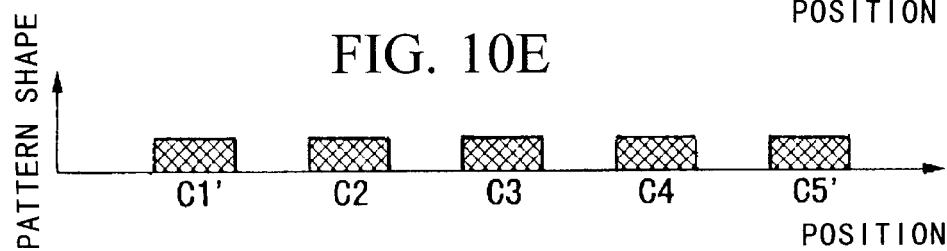

The increased combined exposure quantity makes the line widths in the overlying portion after developing thicker and coincident with the target values as shown in FIG. 10E.

As described above, the line widths of the shapes of the pattern images at the overlying portion formed on the substrate W are so adjusted as to coincide with the target line widths by measuring the shapes of the pattern images at the overlying portion formed on the substrate W using the line width measuring unit 8, controlling the dose adjusting device 4 based on the measuring results and adjusting the dose of exposure light at the overlying portion using the adjusted dose adjusting device 4.

In adjoining shots, for example, only the peripheral portion of one of the exposure areas P1 (or P2) may be moved. That is, with the displacement start position of the blades in one of the exposure areas, P1, taken as the initial state, the displacement start position of the blades in the other exposure area P2 can be changed to adjust the exposure quantity to the overlying portion. In this case, the width of the overlying portion becomes "d+a".

Figure 11:
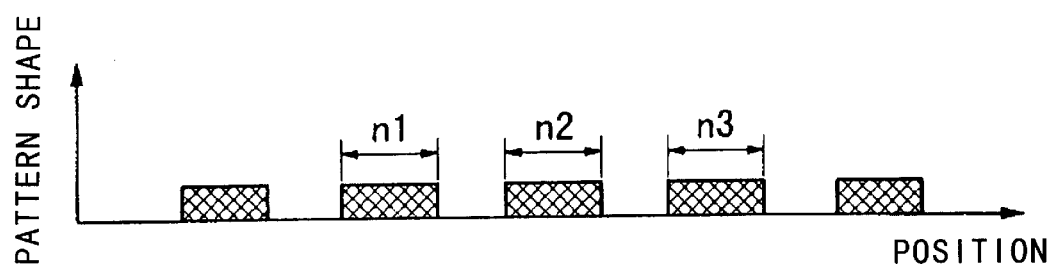
FIG. 11 is a diagram for explaining the shape of a pattern image on a substrate that is measured by a shape measuring system.

If the line widths n1 to n3 of the shapes of the pattern images in the overlying range of the light-reducing areas R1 and R2 are formed thicker than target values as shown in FIG. 11, on the other hand, the control section 9 sets the dose adjusting device 4 in such a way as to change the overlying range of the light-reducing areas R1 and R2.

Figure 12A:
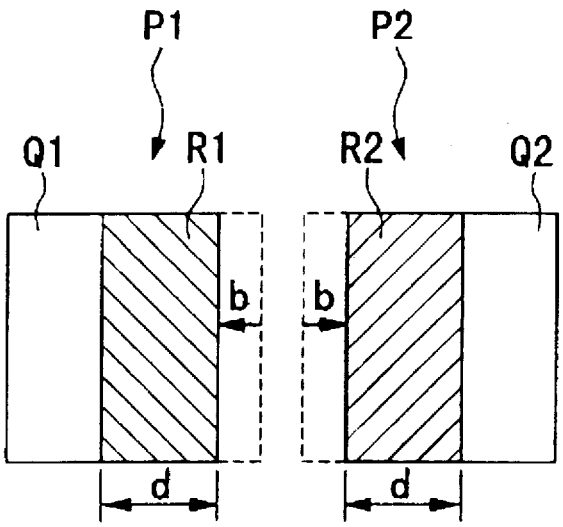
FIGS. 12A through 12D are diagrams for explaining the relationship between a pattern image on a substrate and the light exposure quantity.

That is, when the line widths of the patterns Pr1 and Pr2 measured by the line width measuring unit 8 are thicker than the target values, the control section 9 sets the moving ranges of the blades 4a and 4b of the dose adjusting device 4 in such a way as to reduce the amount of exposure light to this overlying portion. Specifically, as shown in FIG. 12A, the displacement start position of the blades 4a and 4b is changed by a distance "b" to reduce the constant-light-amount areas Q1 and Q2. The blades whose displacement start position has been changed by the distance "b" are moved by the moving distance "d".

Figure 12B:
Figure 12C:
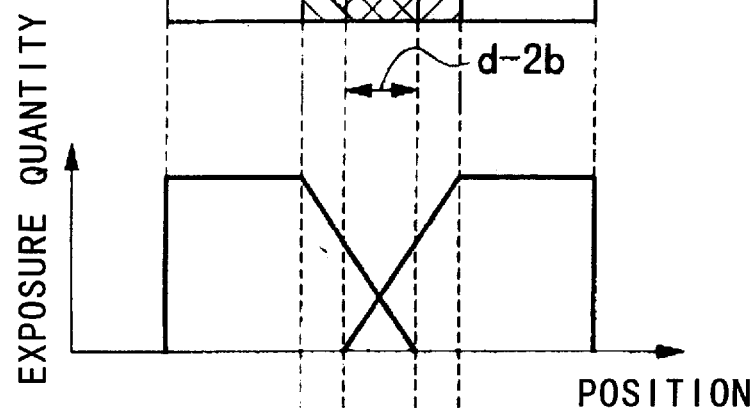
Figure 12D:
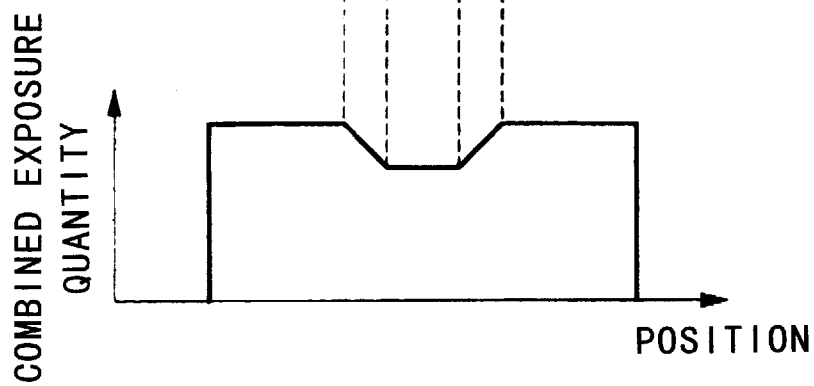

The width of the overlying portion of the thus set shot sizes becomes "d–2b" as shown in FIG. 12B, and the exposure quantity at the overlying portion becomes smaller as shown in FIG. 12C. As shown in FIG. 12D, the combined exposure quantity to the overlying portion is so set as to be smaller than the exposure quantity to the other portion (constant-light-amount areas Q1 and Q2) than the overlying portion. The moving speed and moving distance "d" of the blade 4a (4b) are the same as those set in step 2.

In the above-described manner, the line width measuring unit 8 measures the line widths of the pattern images in the overlying portion and when the measured widths are greater than the target values, the control section 9 controls the dose adjusting device 4 in such a manner as to decrease the exposure quantity to the overlying portion.

Figure 13A:
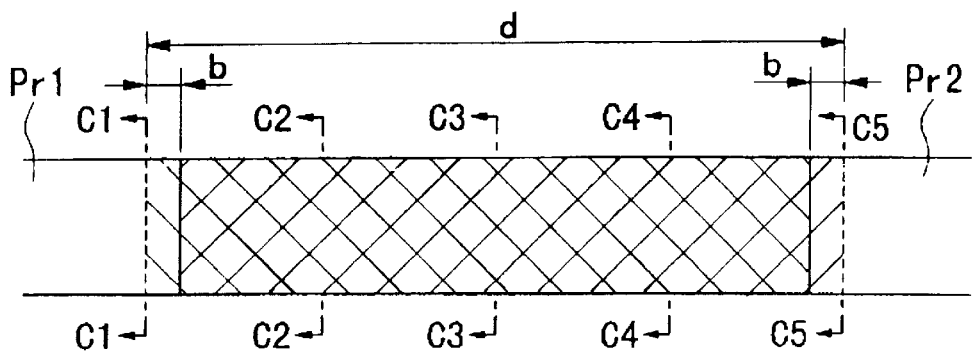
FIGS. 13A through 13E are diagrams for explaining the relationship between a pattern image on a substrate and the light exposure quantity.
Figure 13B:
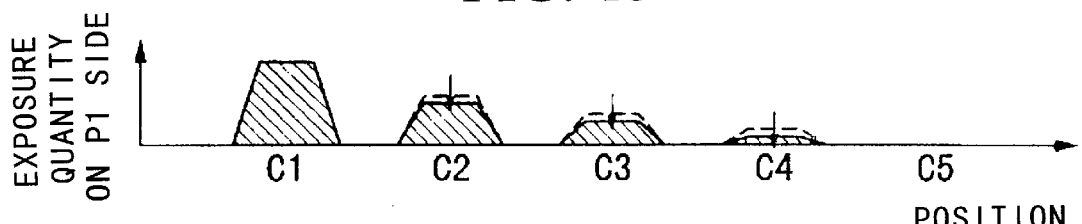
Figure 13C:
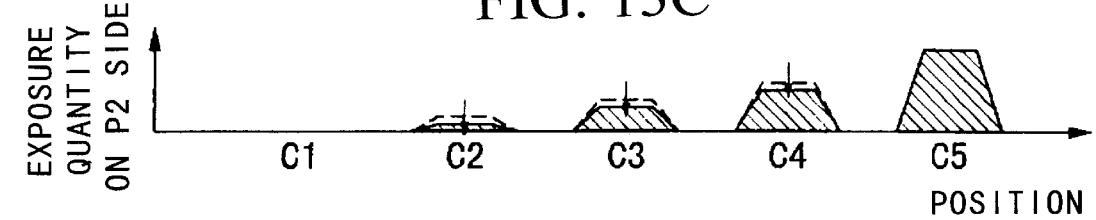
Figure 13D:
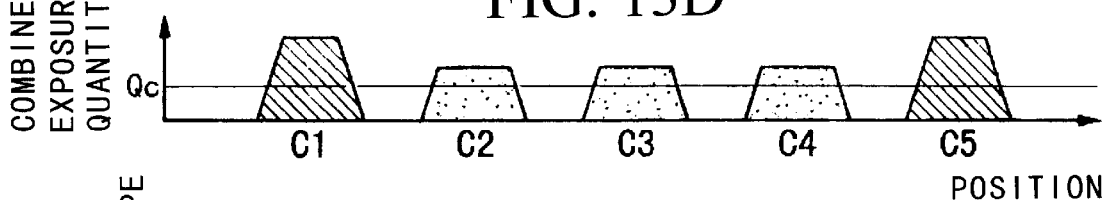

FIGS. 13A through 13E are diagrams showing the exposure quantity distribution at each position of the overlying portion in that state and the shapes of patterns after developing. As shown in FIG. 13B, the exposure quantities to the light-reducing area R1 at the positions c2, c3 and c4 become smaller than those shown in FIG. 6B. Likewise, as shown in FIG. 13C, the exposure quantities to the light-reducing area R2 at the positions c2, c3 and c4 become smaller than those shown in FIG. 6C. As shown in FIG. 13D, therefore, the combined exposure quantity to the overlying portion becomes smaller than the one shown in FIG. 6D.

Figure 13E:
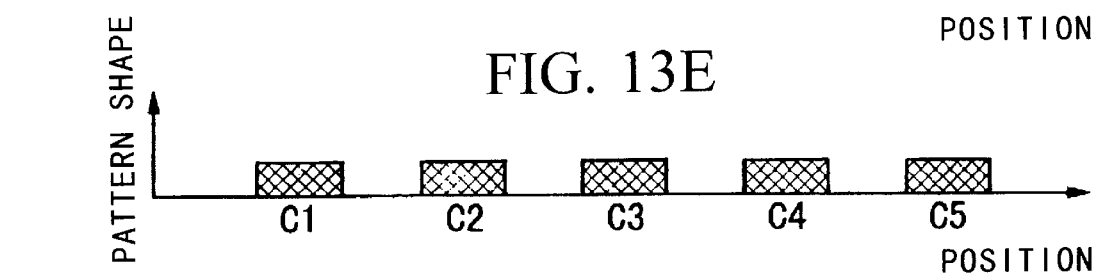

The reduced combined exposure quantity makes the line widths in the overlying portion after developing thinner and coincident with the target values as shown in FIG. 13E. In this case, the shot sizes of one of the exposure areas P1 or P2 may be reduced so that the width of the overlying portion becomes "d–b".

Note that the moving distance "d" of the blades used in step 7 is the one set in step 2. That is, with the size of the light-reducing area R1 (or R2) set constant, the dose of exposure light at the overlying portion is adjusted by changing the overlying range of this constant light-reducing area R1 and the light-reducing area R2 by a predetermined value (e.g., the distance "a" or "b"). But, this moving distance "d" (i.e., the size of the light-reducing area R1 or R2) is changeable.

In this case, the degree of a change in the seam potion in the overlying portion of the adjoining patterns Pr1 and Pr2 becomes gentler as the width of the overlapping portion of the patterns Pr1 and Pr2 (i.e., the moving distance "d") is set larger. It is to be noted however, that if the width "d" is set too large, the number of pattern images to be synthesized increases, thus lowering the efficiency, the width "d" is generally set to about 5 to 10 mm. In this case, of the patterns formed on a plurality of masks M, the patterns that correspond to the overlying portion are so formed as to be identical and wider than the width d. As the distance "a" (or "b") which is a change in the displacement start position of the blades is set to about several $\mu$m (e.g., 2 to 3 $\mu$m), displacing the shot size by the distance "a" (or "b") does not affect the pattern formation. The width "d" may however be set to about 5 to 15 mm depending on the exposure apparatus.

Although the above-described method adjusts the dose of exposure light to the light-reducing area R1 (R2) by setting the pitch of the dose of exposure light to the light-reducing area R1 (R2), i.e., by setting the moving speed of the blades constant, and changing the displacement start position of the blades, the pitch of the dose of exposure light to the light-reducing area R1 (R2) can be set arbitrarily by continuously changing the moving speed of the blades. This is effective in the case where one wants to change the line width of the shape of the pattern only at a certain position (e.g., only at the position c3) in the overlying portion. That is, changing the moving speed of the blades during movement of the portion corresponding to that position changes the exposure quantity at that position, so that the line widths of the pattern can be adjusted.

If the line width at the center position (e.g., the position c3) in the overlying portion is thinner than the target value, for example, the exposure quantity corresponding to this position should be increased. Specifically, the dose of exposure light associated with the center position of the overlying portion is increased by making the moving speed of the blades faster at the portion corresponding to the position c3, as shown in FIG. 14A. As the moving speed of the blades is set slower at the beginning and near the end of the light-reducing areas R1 and R2 which are the overlying portion, on the other hand, the exposure quantities at the positions corresponding to those points (e.g., the positions c1 and c5) are reduced.

The combined exposure quantity at the overlying portion formed by the blades that are moved at such a pitch of speed becomes greater at the center position of the overlying portion as shown in FIG. 14B. Therefore, the line width of the shape of the pattern at the center position of the overlying portion is formed thick. As the exposure quantities at the beginning and the end of the overlying portion (the positions c1 and c5) are set smaller, the exposure quantities at those portions become approximately equal to the exposure quantities to the constant-light-amount areas Q1 and Q2. In this case, the exposure quantity at the overlying portion can be adjusted arbitrarily without changing the displacement start position of the blades.

If the line width at the overlying portion is thicker than the target value, on the other hand, this line width can be made thinner by setting the moving speed of the blades slower at the portion corresponding to the position corresponding to the position of the thick line width to thereby reducing the dose of exposure light onto the substrate W corresponding to that portion.

As apparent from the above, the line width at a desired position alone can be adjusted by making it possible to arbitrarily set the pitch of the moving speed of the blades that are displaced in synchronism with exposure.

Figure 15:
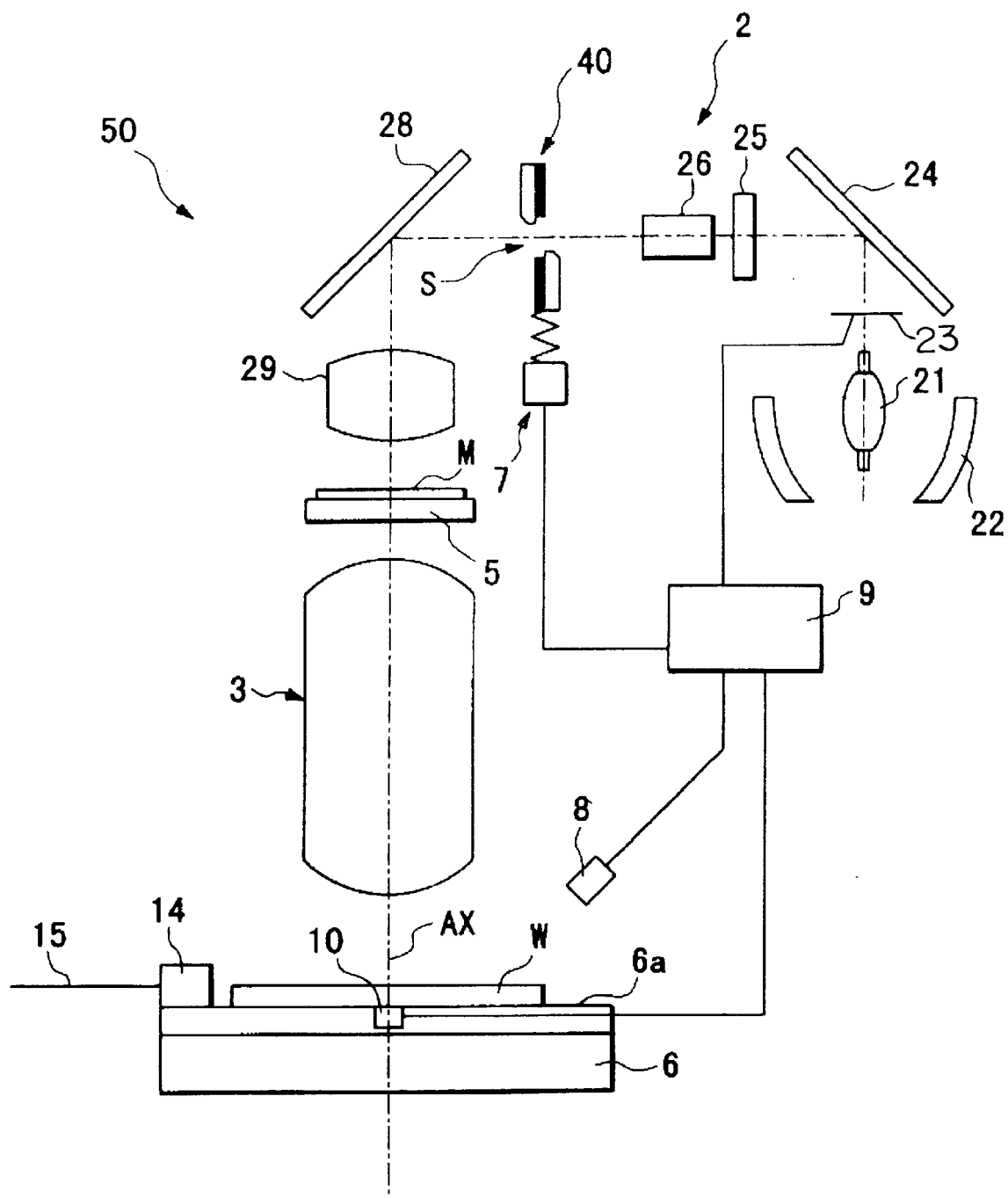
FIG. 15 is a structural diagram illustrating an exposure apparatus according to a second embodiment of the present invention.
Figure 16:
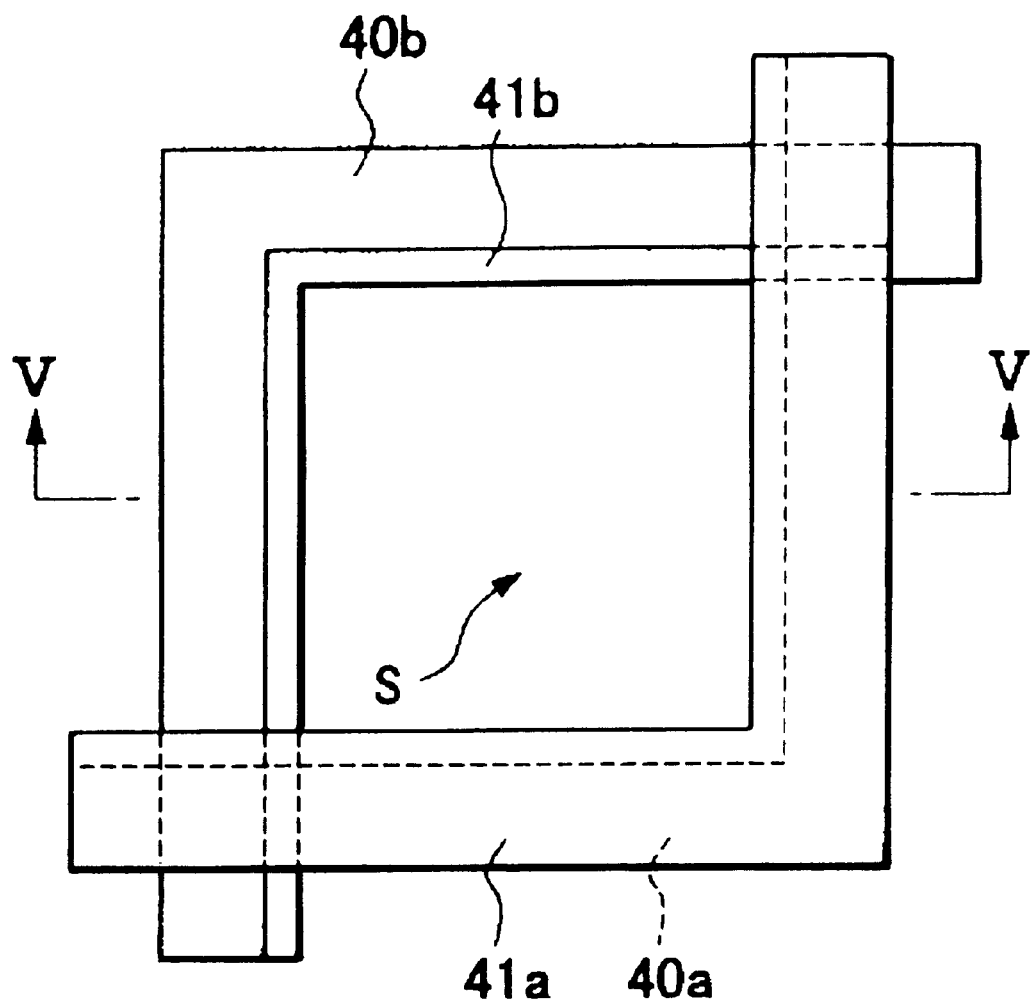
FIG. 16 is a diagram for explaining a dose adjusting device in FIG. 15.

An exposure method and exposure apparatus according to a second embodiment of this invention will now be described with reference to FIGS. 15, 16 and 17.

In those diagrams, an exposure apparatus 50, like the exposure apparatus 1 of the first embodiment, comprises the illumination optical system 2 for illuminating a mask M with exposure light from the light source 21, the mask stage 5 for holding the mask M, the projection optical system 3 for projecting a pattern image of the mask M illuminated with light onto the substrate W, the substrate holder 6a for holding the substrate W, and the substrate stage 6 for supporting this substrate holder 6a.

The illumination optical system 2 includes the elliptic mirror 22 for condensing light from the light source 21 which is comprised of an extra-high pressure mercury lamp, the wavelength filter 25 that passes only that wavelength component which is needed for exposure and which is included in the light condensed by the elliptic mirror 22 and coming from the reflector 24, the fly-eye integrator 26 for adjusting the illumination light, passed through the wavelength filter 25, into light of a uniform illuminance distribution, the reflector 28 and the lens system 29.

A dose adjusting device 40 is located between the fly-eye integrator 26 and the reflector 28 which leads the illumination light to the lens system 29. The dose adjusting device 40, disposed in the illumination optical system 2, adjusts the area of the opening S that passes light to thereby define illumination range for the mask M. The dose adjusting device 40 sends only that light emerging from the fly-eye integrator 26 which has passed the opening S to the lens system 29. The pattern image that is defined by the opening S of the dose adjusting device 40 is formed on the mask M via the lens system 29, so that the pattern image on the mask M is exposed on a specific area on the substrate W.

The dose adjusting device 40, like the one in the first embodiment, has a pair of light-shielding sections (blades) 40a and 40b, which are each bent into an L shape two-dimensionally and form a rectangular opening S when combined in such a way as to be perpendicular to the optical axis of illumination light. Those blades 40a and 40b can be moved within the plane perpendicular to the optical axis by the light-shielding-section displacing device 7. The size of the opening S changes in accordance with changes in the positions of the blades 40a and 40b.

ND filters (light-reducing members) 41a and 41b are integrally attached to the surfaces of the respective blades 40a and 40b. The end portions of the ND filters 41a and 41b on the opening side S protrude by a predetermined amount from the blades 40a and 40b. The blades 40a and 40b including the ND filters (light-reducing members) 41a and 41b constitute the light-shielding section.

Figure 17:
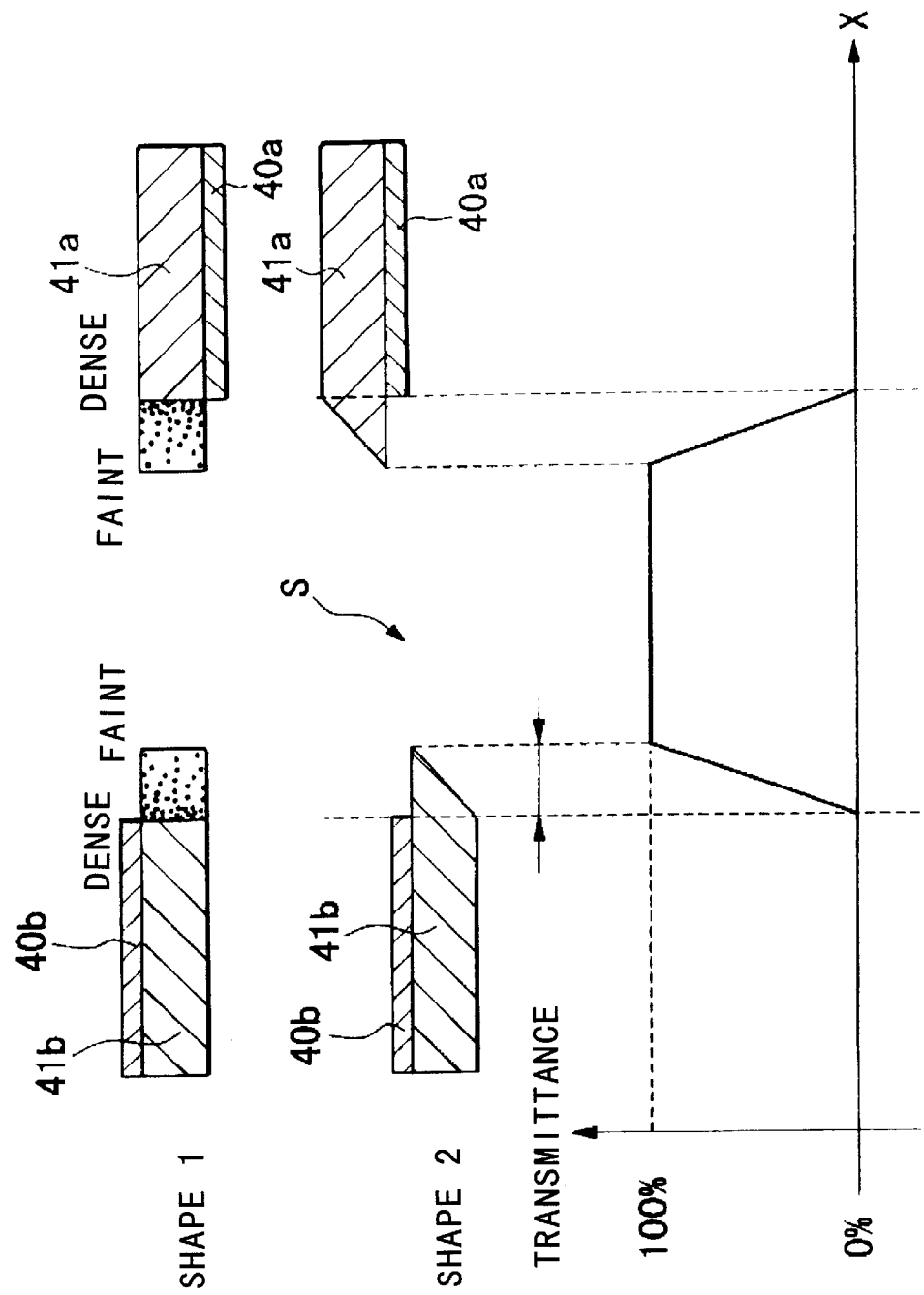
FIG. 17 is a diagram for explaining the dose adjusting device in FIG. 15.

As shown in a shape 1 or shape 2 in FIG. 17, density filters are formed at the projections of the ND filters 41a and 41b from the blades 40a and 40b in such a way that they become thinner in proportion to the amounts of the projections from the blades 40a and 40b. Accordingly, the transmittance of the illumination light in the dose adjusting device 40 is 100% above the opening S, becomes lower around the opening S in the direction away from the center of the opening S in proportion to the distance, and becomes 0% at the edges of the blades 40a and 40b.

The amounts of the projections, L, of the ND filters 41a and 41b from the blades 40a and 40b are constant around the opening S, so that the light-reducing characteristics at the peripheral portion of the opening S become identical all around the opening S except the diagonal corners of the opening S where the ND filters 41a and 41b overlie each other. The protruding amounts L have only to be equal to each other on the opposite sides of the opening S.

In performing exposure on the substrate W using this exposure apparatus 50, first, different exposure areas are exposed using a plurality of masks M with the substrate W not held on the substrate holder 6a and the light exposure quantity at the overlying portion and the light exposure quantity to the portion other than the overlying portion are measured by the illuminance sensor 10, as per the first embodiment.

Next, based on the results of measurement by the illuminance sensor 10, the control section 9 sets the operation of the dose adjusting device 40 in such a way that the light exposure quantity at each position in the overlying portion coincides with the light exposure quantity to the portion other than the overlying portion. Specifically, the light-reducing areas R1 and R2 illustrated in the foregoing section of the first embodiment are formed by the projections of the ND filters 41a and 41b from the blades 40a and 40b, and as the positions of the blades 40a and 40b provided with the ND filters 41a and 41b are changed, the overlying range of the light-reducing areas R1 and R2 is changed. The control section 9 sets the positions of the blades 40a and 40b provided with the ND filters 41a and 41b in such a way that the light exposure quantity at the overlying portion matches the light exposure quantity to the portion other than the overlying portion.

The exposure light coming from the light source 21 passes through the opening S that is formed by the blades 40a and 40b provided with the ND filters 41a and 41b. The blades 40a and 40b are fixed at the set positions, so that the size of the opening S is set constant. The illumination area of the mask M is defined by the opening S and light to the peripheral portion of the pattern image on the substrate W is reduced by the opening S which is provided with the density filters 41a and 41b.

When transfer of a pattern image on a single mask M to the substrate W is completed, the substrate stage 6 is moved in the horizontal direction, and the mask M that has been used in this first exposure is replaced with another mask M which has a pattern to be formed on an exposure area different from the first exposure area. The pattern image to be transferred by the second exposure is transferred in such a way that its peripheral portion overlies the peripheral portion of the pattern image transferred by the first exposure. In this manner, exposure is carried out with the light exposure quantity at the overlying portion of the substrate W set equal to the light exposure quantity to the portion other than the overlying portion, as per the first embodiment.

Next, a developing process is performed on this substrate W, and the shape (line width) of the pattern formed on the overlying portion of the substrate W that has undergone the developing process and the shape (line width) of the pattern formed on the portion other than the overlying portion are measured by the line width measuring unit 8. The line width measuring unit 8 sends the measured line width data to the control section 9. Based on the measuring results from the line width measuring unit 8, the control section 9 causes the dose adjusting device 40 to adjust the dose of the exposure light at the light-reducing areas R1 and R2 which are equivalent to the overlying portion.

Suppose that the line widths of the overlying portion are thinner than the target values as shown in FIG. 8, for example. If the resist characteristics are determined in such a way that the portion whose exposure quantity exceeds a given exposure quantity Qc (i.e., the portion where a greater quantity of exposure light is irradiated) remains on the substrate W after developing, the line widths in the overlying portion become the target line widths by irradiating a greater quantity of exposure light to the overlying portion.

At this time, the blades 40a and 40b are so displaced as to widen the opening S. Specifically, as the blades 40a and 40b provided with the ND filters 41a and 41b are moved by a distance "a" outward from the center side of the opening S, the sizes of the constant-light-quantity areas Q1 and Q2 are enlarged by the quantity corresponding to the distance "a" as shown in FIGS. 9A–9D. The opening S is formed by the blades 40a and 40b which are fixed, displaced by the distance "a". In this case, the moving distance "d" as shown in FIGS. 9A–9D is equivalent to the protruding amounts L of the ND filters 41a and 41b from the blades 40a and 40b.

As the exposure light is irradiated on the substrate W in this situation, the combined exposure quantity at the overlying portion is increased as shown in FIG. 9D. This makes the line widths of the pattern at this overlying portion thicker so as to be approximately equal to the target values.

If the line widths of the overlying portion are thicker than the target values, on the other hand, the blades 40a and 40b are so displaced as to narrow the opening S, and exposure is executed in this state. Specifically, as the blades 40a and 40b provided with the ND filters 41a and 41b are moved by a distance "b" toward the center of the opening S from the outside the opening S, the sizes of the constant-light-quantity areas Q1 and Q2 are reduced by the amount corresponding to the distance "b" as shown in FIGS. 12A–12D. The opening S is formed by the blades 40a and 40b, which are fixed, displaced by the distance "b". In this case, the moving distance "d" in as shown in FIGS. 12A–12D is equivalent to the protruding amounts L of the ND filters 41a and 41b from the blades 40a and 40b.

As the exposure light is irradiated on the substrate W in this situation, the combined exposure quantity at the overlying portion is reduced as shown in FIG. 12D. This makes the line widths of the pattern at this overlying portion thinner so as to be approximately equal to the target values.

The light-reducing characteristics of the ND filters 41a and 41b may be set, as desired, so as to enhance the light reduction at the end positions of the light-reducing area besides the proportional light reduction in the direction away from the center of the opening S. For example, designing the protruding portions of the ND filters 41a and 41b from the blades 40a and 40b into arc-shapes in cross section can change the light-reducing characteristics of the ND filters 41a and 41b in a curve from the center of the opening S.

The adjustment of the light exposure quantity at the overlying portion using the light-reducing members (ND filters) can be accomplished not only by a scheme of displacing the blades provided with the ND filters by the distance "a" (or "b") but also by replacing the ND filters with other ND filters which have different density characteristics. Alternatively, the adjustment can be accomplished by changing the protruding amounts L The setting of the distance "a" (or "b") by which the blades 40a and 40b provided with the ND filters 41a and 41b are displaced and the alteration of the light-reducing characteristics of the ND filters are carried out based on the relationship between the previously acquired amount of a change in the dose of exposure light to the substrate W and the amount of a change in the shape of the pattern image. Specifically, those operations can be carried out by previously acquiring a plurality of data items about the amount of a change in the shape (line width) of the pattern image on the substrate W when the dose of exposure light is changed arbitrarily and based on the plurality of data items (data table) as mentioned above.

The relationship between the dose of exposure light and a change in the shape of the pattern image may be acquired as a relational equation based on the above-described data table, and the dose of exposure light at the overlying portion may be adjusted from the result of measurement by the line width measuring unit 8.

The light-reducing member may be constructed not only by ordinary optical light-reducing filters but also by using other means, such as a liquid crystal and EC. Light reduction can be achieved by blurring the edge images of the opening S by shifting the focus of the lens. Specifically, in addition to the conventional light-shielding section, a second light-shielding section may be provided, shifted in the direction of the optical axis, so that light reduction is accomplished by blurring the image of the opening of the second light-shielding section on a mask.

Figure 18A:
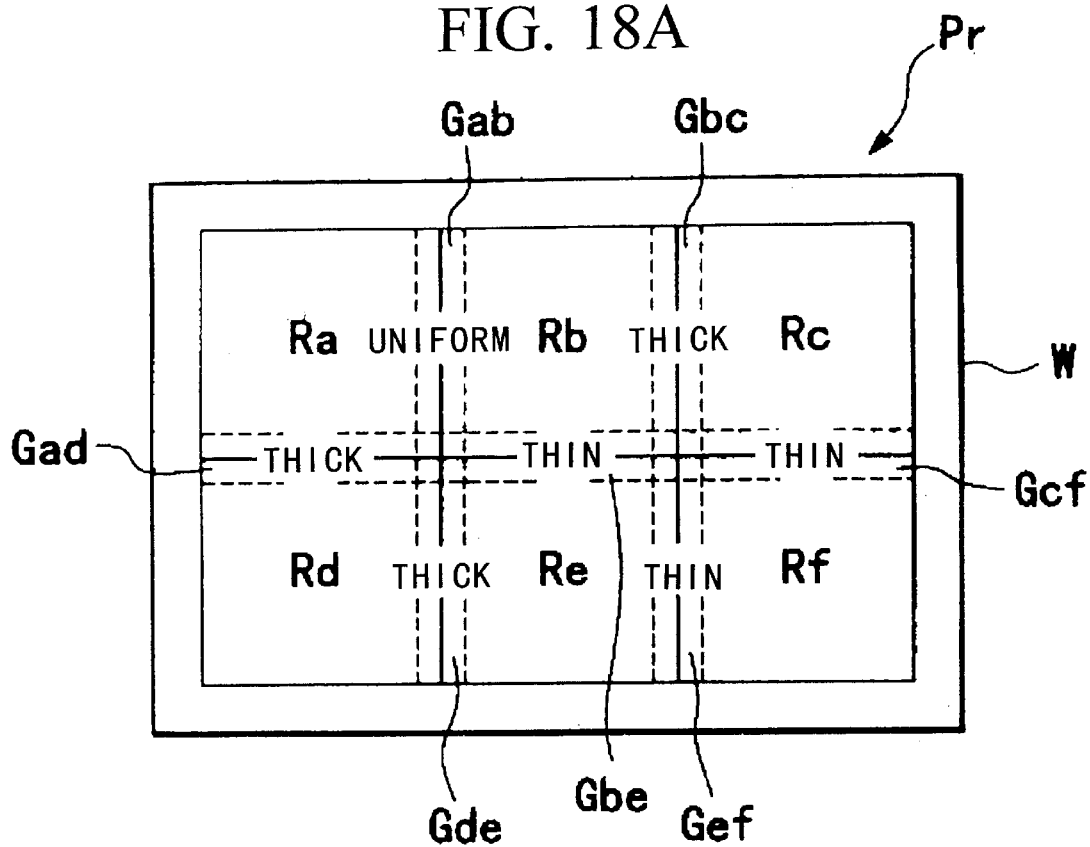
FIGS. 18A and 18B are diagrams for explaining how a plurality of exposure areas are overlaid on a substrate.
Figure 18B:
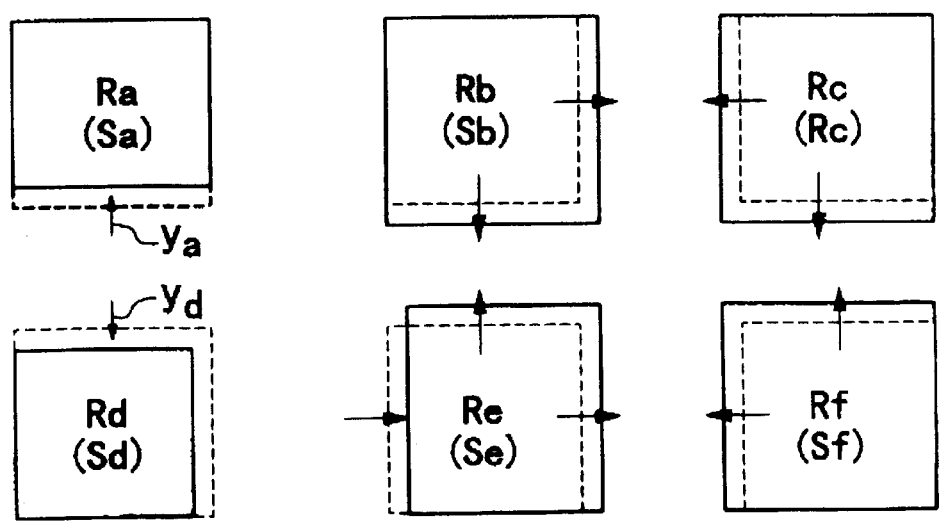

FIGS. 18A and 18B exemplify the case where the top of the substrate W is divided into a plurality of (six) rectangular exposure areas Ra to Rf from which a pattern Pr is combined. In this case, exposure is carried out by sequentially using masks Ma to Mf corresponding to the respective exposure areas Ra–Rf. The masks Ma–Mf are designed in such a way as to have the same pattern only at the overlying portion at the time of pattern synthesis.

Figure 19:
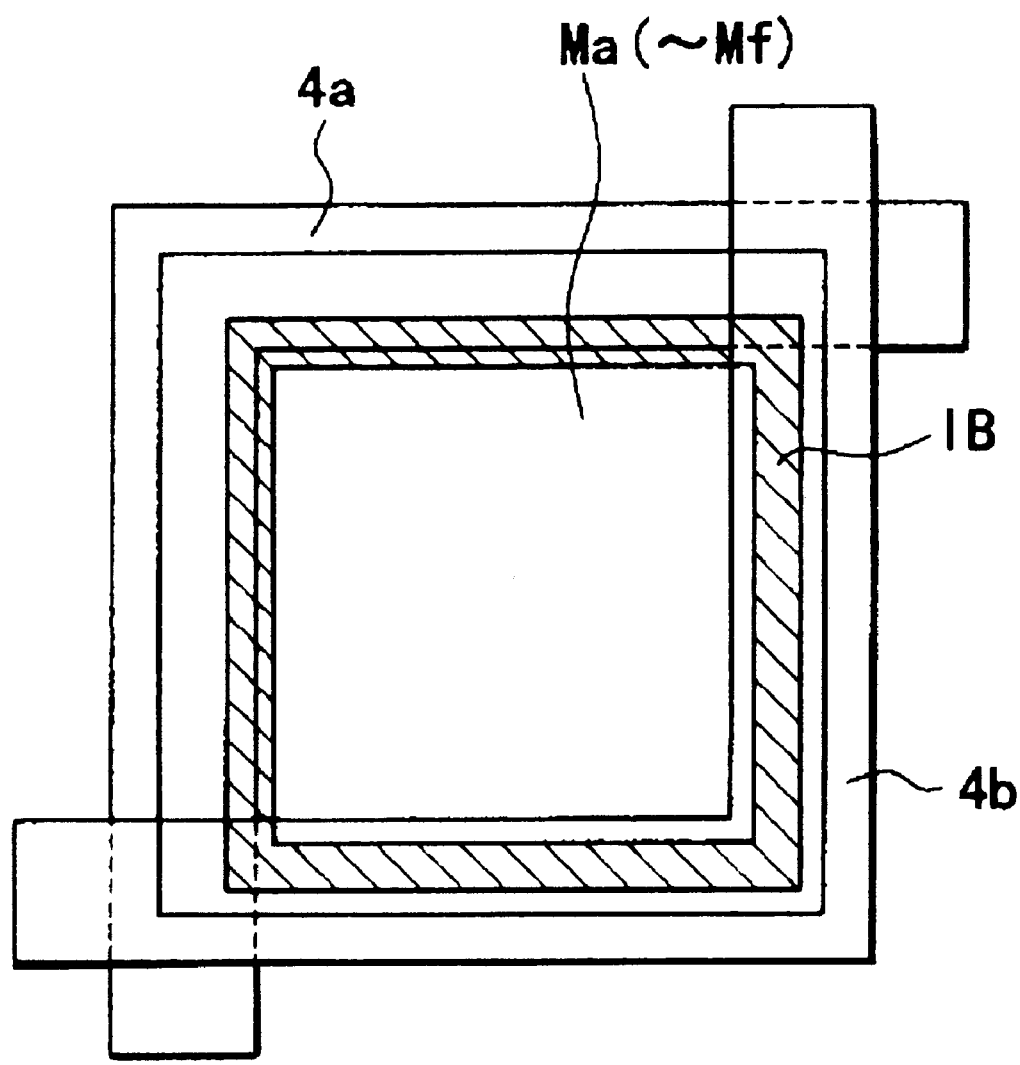
FIG. 19 is a diagram for explaining the positional relationship between a mask on which individual exposure areas in FIGS. 18A and 18B are to be formed and the light-shielding section.

In this case, formed around each of the masks Ma–Mf is a light-shielding band IB with a light transmittance of 0%, which completely inhibits light transmission as shown in FIG. 19. The boundary portions of the exposure areas Ra–Rf are overlaid by a desired amount (the aforementioned "d" or "L"), and the blades 4a and 4b are positioned at the time of each exposure in such a way that the light-reducing area formed by the movement of the blades 4a and 4b coincides with the overlying portion of the exposure areas Ra–Rf.

In exposing the exposure area Ra, the blade 4b located on the right side and the bottom side of the mask Ma is positioned in such a way that the light-reducing area protrudes from the light-reducing band IB and the blade 4a located on the left side and the top side of the mask Ma is positioned in such a way as to be completely retracted into the light-reducing band IB in FIGS. 18A and 19. Likewise, though not illustrated, in exposing the exposure area Rb, the blade located on the right side, left side, and the bottom side of the mask Mb is positioned in such a way that the light-reducing area protrudes from the light-reducing band IB and the blade located on the top side of the mask Mb is positioned in such a way as to be completely retracted into the light-reducing band IB. Likewise, the blade located on the left side and the bottom side of the mask Mc is positioned in such a way that the light-reducing area protrudes from the light-reducing band IB, and the blade located on the right side and the top side of the mask Mc is positioned in such a way as to be completely retracted into the light-reducing band IB, the blade located on the right side and the top side of the mask Md is positioned in such a way that the light-reducing area protrudes from the light-reducing band IB and the blade located on the left side and the bottom side of the mask Md is positioned in such a way as to be completely retracted into the light-reducing band IB, the blade located on the left side, the right side and the top side of the mask Me is positioned in such a way that the light-reducing area protrudes from the light-reducing band IB and the blade located on the bottom side of the mask Me is positioned in such a way as to be completely retracted into the light-reducing band IB, and the blade located on the left side and the top side of the mask Mf is positioned in such a way that the light-reducing area protrudes from the light-reducing band IB and the blade located on the right side and the bottom side of the mask Mf is positioned in such a way as to be completely retracted into the light-reducing band IB. In other words, the blade located at the overlying portion of the individual exposure areas Ra–Rf is positioned in such a way as to protrude from the light-reducing band IB and the blade located on the portion other than the overlying portion (i.e., at the peripheral portion of the pattern Pr) is positioned in such a way as to be completely retracted into the light-reducing band IB.

After the substrate W, whose exposure areas Ra–Rf have undergone such exposure, is subjected to a developing process, the line widths at the individual overlying portions are measured by the line width measuring unit 8. The measuring results then are shown in FIG. 18A. As apparent from this figure, the line width of an overlying portion Gab of the exposure areas Ra and Rb is equal to the target value.

The following will discuss the cases where the line width of an overlying portion Gbc is thicker than the target value, the line width of an overlying portion Gad is thicker than the target value, the line width of an overlying portion Gbe is thinner than the target value, the line width of an overlying portion Gcf is thinner than the target value, the line width of an overlying portion Gde is thicker than the target value, and the line width of an overlying portion Gef is thinner than the target value.

Suppose that the resist characteristics are designed in such a way that the portion which is irradiated with a greater quantity of exposure light remains on the substrate W even after developing when the line width of an overlying portion Gad is thicker than the target value. To irradiate a greater quantity of exposure light onto the overlying portion, the displacement start positions of the blades at the position corresponding to the overlying portion Gad are changed toward the centers of openings Sa and Sd from outside thereof, i.e., in the directions of arrows ya and yd to narrow the openings Sa and Sd as shown in FIG. 18B, and they start moving from the changed displacement start positions. Likewise, the displacement start positions of the blades at the position corresponding to the overlying portion whose line width is thicker than the target value are changed toward the centers of the respective openings from outside thereof, while the displacement start positions of the blades at the position corresponding to the overlying portion whose line width is thinner than the target value are changed outward from the centers of the respective openings, and their movements start in synchronism with exposure.

In the case where pattern images are exposed on the substrate W while the peripheral portions of a plurality of exposure areas are overlaid one on another in the above-described manner, the line widths of the individual overlying portions are surely matched with one another.

Plural types of patterns may be formed on a single mask M and pattern synthesis may be carried out by changing the illumination area (to different pattern areas) in the mask M by the dose adjusting device 4 in accordance with the alteration of the exposure area on the substrate W.

The exposure apparatus of this embodiment may be adapted to a scanning type exposure apparatus which exposes a pattern on a mask by moving the mask and the substrate in synchronism with each other.

Although the foregoing description of this embodiment has been given for the case where moving the blades 4a and 4b is carried out as one way to reduce the light exposure quantity at the overlying portion of the peripheral portions of pattern images at the peripheral portions, density filters may be overlaid at the end portions of the blades 4a and 4b to reduce the light exposure quantity at the peripheral portions. At this time, the area of the overlying portion may be shifted by changing the positions of the blades 4a and 4b and the positions of the density filters together, and the dose of exposure light may be adjusted in such a way that the line width of the pattern becomes constant.

In this embodiment, a pattern on a mask is projected and exposed onto a photoresist that is applied to a photosensitive substrate. The description of the subsequent process has been given for the relationship between the pattern shape and the quantity of exposure in the case of using a negative photoresist whose portion that has been exposed with exposure light becomes hardened, and whose portion that has not been irradiated with exposure light is dissolved away in the developing process.

In the case of using a positive photoresist whose portion that has been exposed with exposure light is dissolved, in the developing process forming a photoresist pattern, the relationship between the size of the pattern shape and the light exposure quantity would be reversed.

Although the foregoing description of this embodiment has been given of an apparatus and method which optimize the light exposure quantity at the overlying portion by measuring the size of the pattern to be formed by the photoresist, the present invention is not limited to this particular case. For example, etching may be carried out based on the pattern of the photoresist and the line width of the actual pattern formed may be measured by the shape measuring unit 8 or a separate shape measuring machine or the like so that the light exposure quantity in the exposure apparatus is set based on that line width.

The exposure apparatus of this embodiment may be adapted to a proximity exposure apparatus that exposes a mask pattern without using the projection optical system by setting a mask and the substrate close to each other.

The exposure apparatus is not limited to the use in the fabrication of semiconductor devices, but can be adapted to a variety of applications, such as an exposure apparatus for a liquid crystal that exposes a liquid crystal display device pattern on a square glass plate and an exposure apparatus for manufacturing a thin-film magnetic head.

The light source of the exposure apparatus embodying the present invention can use charged particle rays, such as X rays and an electron beam, as well as g rays (436 nm), i line (365 nm), KrF excimer laser (248 nm), ArF excimer laser (193 nm) and $F_2$ laser (157 nm).

The projection optical system is not limited to a reduction type, but may be either an equal magnification or a magnification type.

With regard to the projection optical system, when infrared rays, such as an excimer laser beam, are used, a material which transmits extreme ultraviolet radiation, such as a quartz or fluorite, should be used as a glass material, and when an $F_2$ laser or X rays are used, a catadioptric optical system or a refraction optical system (a reflection type reticle should be used) should be used.

When a linear motor is used for the substrate stage or the mask stage, either an air float type using an air bearing or a magnetic float type using Lorentz force or reactance force may be used. The stages may be designed to move along guides or may be a guide-less type.

When a plane motor is used as the stage driving unit, one of a magnetic unit (permanent magnet) and an armature unit should be connected to the stage and the other one should be provided on the moving surface side (base) of the stage.

The reactive force that is generated by the movement of the substrate stage may be caused to mechanically escape into the floor (ground) by using a frame member as described in U.S. Pat. No. 5,744,924 which corresponds to Japanese Unexamined Patent Application, First Publication No. Hei 8-166475. The present invention may be adapted to an exposure apparatus that has such a structure. The reactive force that is generated by the movement of the mask stage may be caused to mechanically escape into the floor (ground) by using a frame member as described in Japanese Patent Application, First Publication No. Hei 8-330224. The present invention may also be adapted to an exposure apparatus that has such a structure.

As described above, the exposure apparatus of this embodiment is manufactured by assembling various sub systems including the individual constituting elements as recited in the appended claims while keeping a predetermined mechanical precision, electrical precision and optical precision. To secure those precisions, various optical systems are adjusted to achieve the optical precision, various mechanical systems are adjusted to achieve the mechanical precision and various electric systems are adjusted to achieve the electrical precision before and after the assembling. The process of assembling various sub systems into the exposure apparatus includes mechanical connection of various sub systems, interconnection of electric circuits and connecting pipes to a pressure circuit. The process of assembling each sub system comes before the process of assembling various sub systems into the exposure apparatus. When the process of assembling various sub systems into the exposure apparatus is completed, general adjustment is carried out to guarantee various precisions of the exposure apparatus as a whole. It is desirable to manufacture the exposure apparatus in a clean room where the temperature and the degree of cleanness are controlled.

Figure 20:
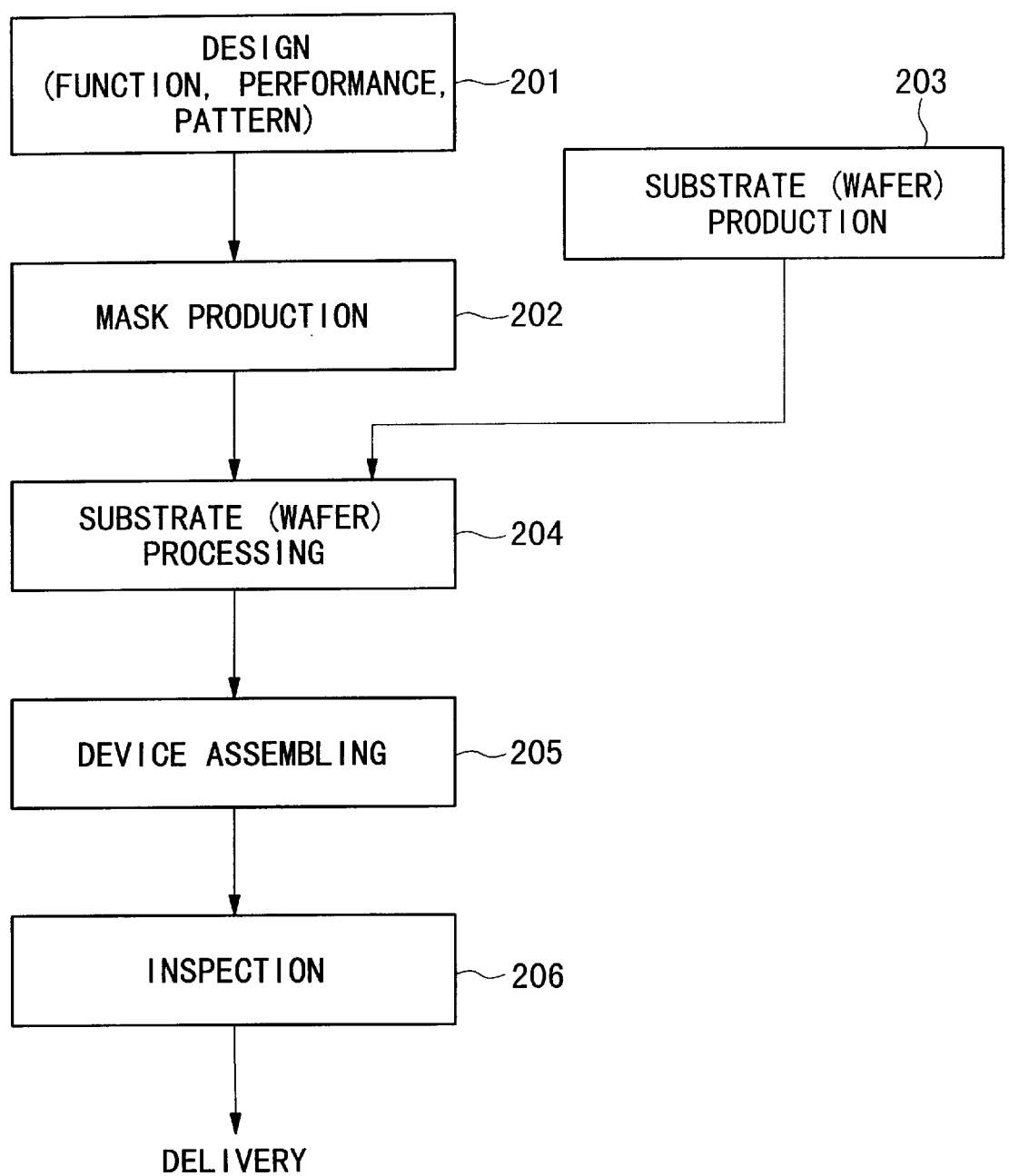
FIG. 20 is a flowchart illustrating one example of a fabrication process for a semiconductor device.

As shown in FIG. 20, a semiconductor device is fabricated through step 201 for designing the functions and performance of the device, step 202 for producing masks based on this design step, step 203 for producing a substrate (wafer) from a silicon material, substrate processing step 204 for exposing a mask pattern on the substrate using the exposure apparatus of the above-described embodiment, device assembling step 205 (including a dicing step, bonding step and packaging step) and inspection step 206.

What is claimed is:

1. An exposure method in which, at a time of transferring a pattern image of a mask illuminated with exposure light onto a substrate, exposure is performed by overlaying portions of an exposure area with respect to an exposure area containing a pattern image, which has previously been transferred onto said substrate, said exposure method comprising:

adjusting a dose of said exposure light on an overlying portion, on which said exposure areas are overlaid with each other, so that a shape of a pattern to be formed in the overlying portion becomes an intended shape, while changing shapes of said exposure areas during irradiation of said exposure light.

2. An exposure method according to claim 1, wherein said dose of said exposure light at said overlying portion is adjusted, by setting said dose of said exposure light at said peripheral portion of said exposure area including a pattern image so as to decrease in a direction away from a center of said exposure area, and by relatively moving said exposure areas to change an overlying range of said peripheral portions of pattern images.

3. An exposure method according to claim 1, wherein said exposure area is determined by a light-shielding section, and said dose of said exposure light at said peripheral portion is set by continuously changing a moving speed of said light-shielding section which displaces in synchronism with exposure.

4. An exposure method according to claim 1, wherein said exposure area is determined by a light-shielding section including a light-reducing member having a light-reducing characteristic which makes a light transmittance smaller in a direction away from a center of said pattern image, and said dose of said exposure light at said peripheral portion is adjusted by changing an area of an overlying portion formed by said light-reducing member by using said light-reducing member.

5. A device production method comprising:

exposing a predetermined pattern on a substrate using said exposure method according to claim 1; and developing said substrate after said exposure.

6. An exposure apparatus which transfers a continuous pattern onto a substrate while overlaying peripheral portions of exposure areas including pattern images with each other, comprising:

an illumination optical system which illuminates a mask with exposure light from a light source;

a projection optical system which projects a pattern image of said mask onto said substrate;

a light-shielding section which sets an exposure area on said mask to be illuminated by said illumination optical system;

a dose adjusting device which controls a dose of exposure light at an overlying portion at which said exposure areas are overlapped with each other by adjusting an overlapping amount of said exposure areas, and controls the dose of exposure light to said overlying portion by changing shapes of said exposure areas by moving said light-shielding section while performing irradiation of said exposure light;

a shape measuring system which measures a shape of a pattern formed on said substrate; and a control system which controls said dose adjusting device based on a result of measurement by said shape measuring system in such a way that said shape of said pattern of said overlying portion formed on said substrate becomes an intended shape.

7. An exposure apparatus according to claim 6, wherein said dose adjusting device comprises:

a light-shielding section which arbitrarily sets an exposure area on said mask to be illuminated with said exposure light; and a light-shielding section displacing device which displaces said light-shielding section in such a way that a dose of said exposure light at said peripheral portion of said exposure area of said pattern image becomes smaller in a direction away from a center of said exposure area in synchronism with exposure.

8. An exposure apparatus according to claim 7, wherein said light-shielding-section displacing device can arbitrarily set a displacement start position of said light-shielding section.

9. An exposure apparatus according to claim 7, wherein said light-shielding-section displacing device can arbitrarily set a displacement speed of said light-shielding section.

10. An exposure apparatus according to claim 6, wherein said dose adjusting device comprises:

a light-reducing member which is provided at a periphery of an opening for passing said exposure light so as to make a light transmittance smaller in a direction away from a center of said opening; and a light-reducing-member position adjusting device which adjusts a position of said light-reducing member.

11. An exposure apparatus according to claim 6, further comprising:

a dose measuring system which measures a dose of said exposure light at said overlying portion of a pattern image to be irradiated on said substrate and a dose of said exposure light at other portions than said overlying portion.

12. An exposure apparatus according to claim 6, wherein said control system stores a correlation between said overlapping amount and said shape of said pattern.

13. A device production method in which devices are produced by exposing a plurality of patterns on a substrate while overlaying peripheral portions of said patterns on each other to form an overlying portion, said device production method comprising:

a step of adjusting an amount of overlaying of said peripheral portions so as to change light exposure quantities in said overlying portion and in non-overlying portions which are adjacent to said overlying portion; and a step of exposing said plurality of patterns on said substrate based on said adjusted amount of overlaying.

14. A device production method according to claim 13, wherein said step of adjusting comprises:

a step of measuring a pattern shape of said overlying portion exposed on said substrate; and a step of obtaining an amount of overlaying of said peripheral portions based on said pattern shape measured in said step of measuring.

15. An exposure method in which a pattern image of a mask is transferred onto a substrate, comprising:

a first exposure step of exposing said pattern onto said substrate;

a second exposure step of exposing a pattern so as to overlay a peripheral portion of an exposure area on a peripheral portion of an exposure area exposed in said first exposure step, and adjusting an overlapping amount of said exposure areas while changing shapes of said exposure areas of said patterns during exposure of said patterns so that the shape of pattern images ovelappedly exposed in said first and second exposure steps become an intended shape.

16. An exposure method according to claim 15, wherein:

said shape of said pattern image is determined by measuring line width of said pattern; and in said second exposure step, said overlapping amount is adjusted so that a line width of said pattern in a first portion overlappedly exposed in said first and second exposure steps becomes substantially equal to a line width of said pattern in a second portion which was exposed in said first exposure step or in second exposure step and is different from said first portion.

17. An exposure method according to claim 15, wherein:

in said second exposure step, an exposure is performed using a relationship between a predetermined overlapping amount of said exposure areas and an exposure amount in an overlapping portion of said exposure areas.

18. An exposure method according to claim 15, wherein a line width of said pattern in said overlapping portion is measured after said exposure in said second exposure step is performed.

19. An exposure method according to claim 15, wherein each of said first and second exposure steps comprises positioning the mask at a predetermined position.

20. An exposure method according to claim 19, wherein said overlapping amount is adjusted by changing a position of an opening surrounded by a light-shielding section with respect to said pattern on said mask.

21. An exposure method according to claim 15, further comprising:

adjusting an overlapping amount of a light-reducing area in a first exposed area exposed in said first exposure step and a light-reducing area in a second exposed area exposed in said second exposure step; and thereby substantially equalizing a shape of a pattern formed in an overlapping portion to a shape of a pattern formed in said first exposed area or said second exposed area.

22. An exposure method according to claim 21, further comprising:

performing a plurality of exposures while respectively changing overlapping amounts of overlapping portions as exposure conditions;

measuring shapes of patterns exposed at respective exposure conditions;

respectively measuring shapes of patterns formed in overlapping portions and portions except said overlapping portions; and adjusting an overlapping amount of said overlapping portions so that said shapes become an intended shape.

23. An exposure method according to claim 21, wherein a width of said pattern formed in each overlapping portion is controlled by changing said overlapping amount of said overlapping portion.

24. An exposure method according to claim 21, further comprising:

determining a relationship between said shape of said pattern and said overlapping amount of a light-reducing area in a first exposed area and a light-reducing area in a second exposed area.

* * * * *